(12) United States Patent
Eda et al.

(10) Patent No.: US 6,178,035 B1
(45) Date of Patent: Jan. 23, 2001

(54) OPTICAL DEVICE AND METHOD OF MANUFACTURING THE SAME

(75) Inventors: Akira Eda; Kiyofumi Muro, both of Sodegaura (JP)

(73) Assignee: Mitsui Chemicals, Inc., Tokyo (JP)

(*) Notice: Under 35 U.S.C. 154(b), the term of this patent shall be extended for 0 days.

(21) Appl. No.: 08/955,725

(22) Filed: Oct. 22, 1997

Related U.S. Application Data

(60) Continuation of application No. 08/466,990, filed on Jun. 6, 1995, now abandoned, which is a division of application No. 07/901,029, filed on Jun. 19, 1992, now Pat. No. 5,999,325.

(30) Foreign Application Priority Data

Jun. 21, 1991 (JP) .................................................. 3-150618
Sep. 30, 1991 (JP) .................................................. 3-252630
Oct. 4, 1991 (JP) .................................................. 3-258129

(51) Int. Cl.[7] ................................ G02F 1/35; G02B 5/08; G02B 6/00; H01S 3/10
(52) U.S. Cl. .................... 359/326; 359/328; 359/857; 359/858; 372/21; 372/22; 372/23; 372/66; 372/93; 372/99; 385/122; 385/133; 385/146
(58) Field of Search .................... 359/850, 857, 359/858, 861, 834, 618, 727, 328, 332, 326; 372/22, 66, 93, 21, 23, 97, 99; 385/122, 133, 146

(56) References Cited

U.S. PATENT DOCUMENTS

| | | | |
|---|---|---|---|
| 1,581,659 | 4/1926 | Roach | 359/834 |
| 3,154,751 * | 10/1964 | Wentz et al. | 359/861 |
| 3,357,772 * | 12/1967 | Rowland . | |
| 3,360,323 * | 12/1967 | Weisman et al. | 359/834 |
| 3,384,433 | 5/1968 | Bloembergen . | |
| 3,397,362 * | 8/1968 | Grayson et al. | 372/66 |
| 3,743,378 * | 7/1973 | Bowsky | 359/487 |
| 4,083,254 | 4/1978 | Nissi | 359/833 |
| 4,214,813 | 7/1980 | Mcnaney | 359/834 |
| 4,280,752 * | 7/1981 | Shreve | 359/858 |
| 4,486,073 * | 12/1984 | Boyd | 359/530 |
| 4,671,630 | 6/1987 | Takahashi | 359/833 |

(List continued on next page.)

FOREIGN PATENT DOCUMENTS

| | | | |
|---|---|---|---|
| 1622341 | 10/1970 | (DE) . | |
| 0033882 | 8/1981 | (EP) . | |
| 0375216 * | 6/1990 | (EP) . | |
| 203715 | 9/1991 | (JP) | 359/618 |
| WO90/09688 | 8/1990 | (WO) . | |
| WO91/11820 | 8/1991 | (WO) . | |

OTHER PUBLICATIONS

English Language Abstract of JP 62–161532.
English Language Abstract of JP 60–264334.
English Language Abstract of JP 3–292784.
English Language Abstract of JP 3–218067.
English Language Abstract of JP 3–190166.
English Language Abstract of JP 3–168606.
English language Abstract of JP 63–314516.

(List continued on next page.)

* cited by examiner

Primary Examiner—Ricky D. Shaffer

(57) ABSTRACT

An optical device includes a light transmitting non-linear optical material having a first face and a second face. The first and second faces oppose each other. The first face has a plurality of first reflecting portions provided thereon, and the second face has a plurality of second reflecting portions provided thereon. Each of the second reflecting portions corresponds to one of the first reflecting portions. Furthermore, the first and second faces are substantially flat except for at least one convex arcuate portion being formed on at least one of the first and second faces. Additionally, at least one of the first and second reflecting portions is obtained by coating a reflective material on the convex arcuate portion.

19 Claims, 22 Drawing Sheets

U.S. PATENT DOCUMENTS

| | | | |
|---|---|---|---|
| 4,673,918 | * | 6/1987 | Adler et al. ............................ 359/850 |
| 4,867,547 | * | 9/1989 | Vogl ...................................... 359/727 |
| 4,871,232 | * | 10/1989 | Grinberg et al. .................... 359/618 |
| 4,890,289 | | 12/1989 | Basu et al. . |
| 4,903,271 | | 2/1990 | Yasui et al. . |
| 4,912,022 | | 3/1990 | Urquhart et al. . |
| 4,915,486 | | 4/1990 | Hansen ................................. 359/618 |
| 4,916,712 | * | 4/1990 | Bender .................................. 372/93 |
| 4,939,738 | * | 7/1990 | Opower ................................. 372/93 |
| 4,952,026 | | 8/1990 | Bellmann et al. . |
| 5,021,742 | * | 6/1991 | Jacob ..................................... 372/93 |
| 5,035,486 | | 7/1991 | Inokuchi .............................. 359/625 |
| 5,042,931 | * | 8/1991 | Mourier ............................... 359/857 |
| 5,084,879 | * | 1/1992 | Suzuki et al. ......................... 372/22 |
| 5,084,888 | * | 1/1992 | Tajima et al. .......................... 372/66 |
| 5,117,437 | * | 5/1992 | Rand ...................................... 372/66 |
| 5,121,404 | * | 6/1992 | Aoshima et al. ...................... 372/22 |
| 5,173,799 | * | 12/1992 | Tanuma ................................ 359/332 |
| 5,224,198 | * | 6/1993 | Jachimowicz et al. ............. 385/133 |
| 5,245,454 | * | 9/1993 | Blonder ............................... 359/850 |
| 5,355,246 | * | 10/1994 | Tanuma . |
| 5,430,754 | * | 7/1995 | Suzuki t al. . |
| 5,608,577 | * | 3/1997 | Eda . |
| 5,728,509 | * | 3/1998 | Eda et al. . |
| 5,999,325 | * | 12/1999 | Eda et al. . |

OTHER PUBLICATIONS

English language Abstract of JP 62–161532,

English language Abstract of JP 61–112101.

English language Abstract of JP 60–264334.

English language Abstract of JP 59–147586.

English language Abstract of JP 58–185445.

Patent Abstracts of Japan, vol. 12, No. 425 (E–681), Nov. 1988 & JP–A–63 164 386.

IBM Technical Disclosure Bulletin, vol. 21, No. 12, May 1979, p. 4787.

IBM Technical Disclosure Bulletin, vol. 29, No. 8, Jan. 1987, p. 3395.

Measurement of Science and Technology, vol. 1, No. 8, Aug. 1990, pp. 759–766.

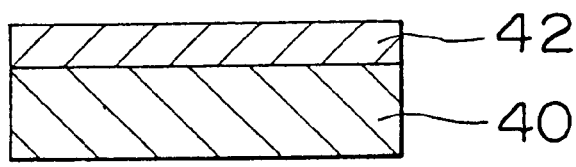
FIG. 2a
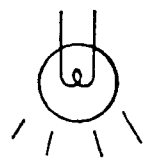
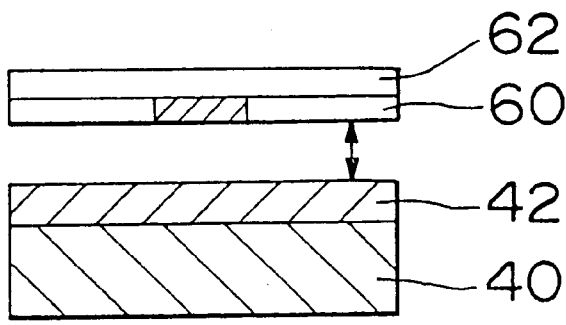
FIG. 2b
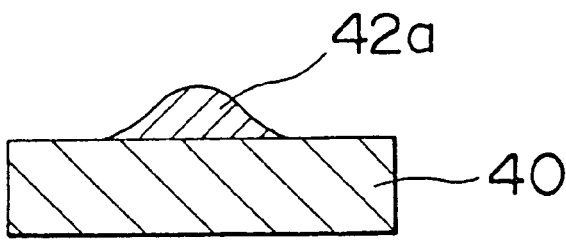
FIG. 2c
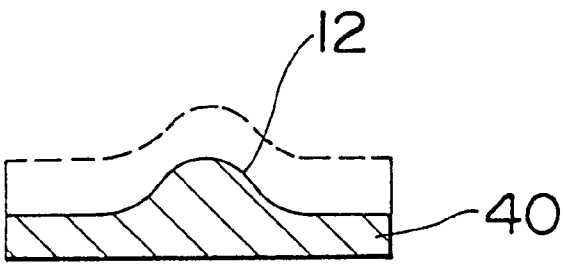
FIG. 2d FIG. 3a
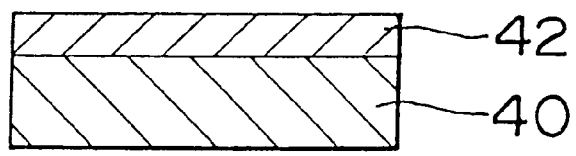
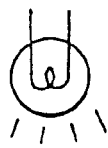
FIG. 3b
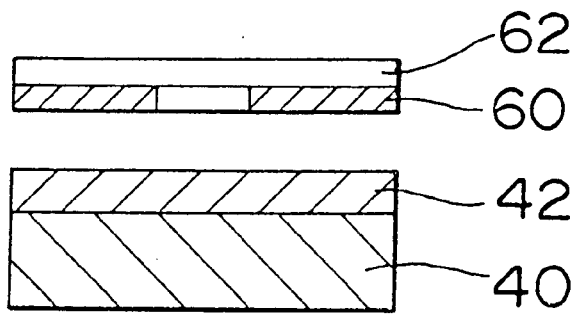
FIG. 3c
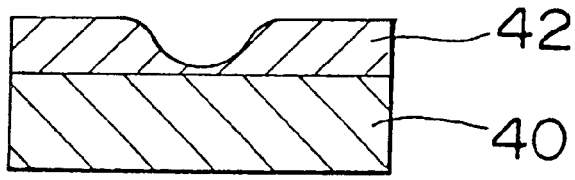
FIG. 3d
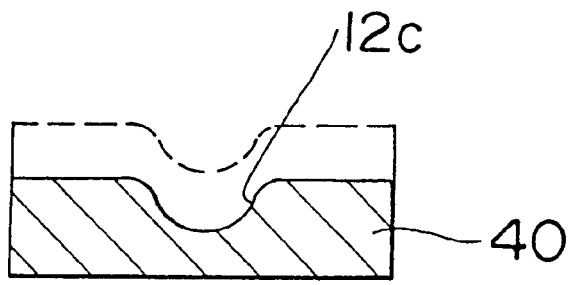

FIG. 4a
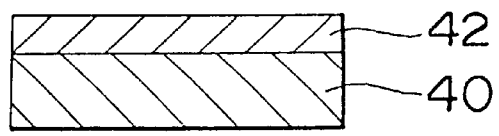
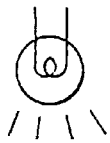
FIG. 4b
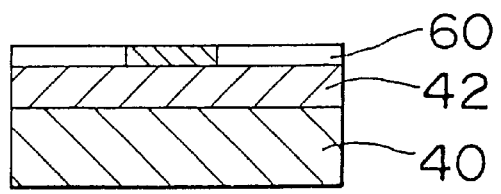
FIG. 4c
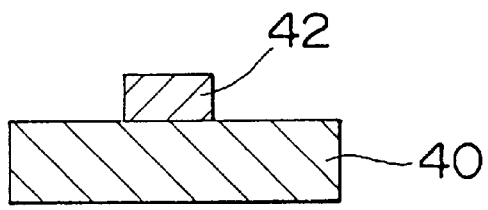
FIG. 4d
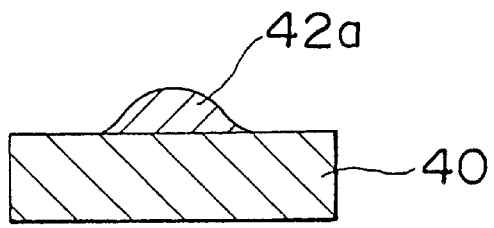
FIG. 4e
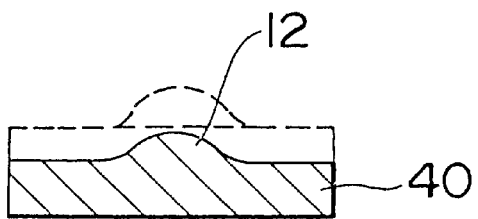

OPTICAL DEVICE AND METHOD OF MANUFACTURING THE SAME

This application is a X continuation, of application Ser. No. 08/466,990 filed on Jun. 6, 1995, now abandoned; which was a divisional of application Ser. No. 07/901,029 filed on Jun. 19, 1992 now U.S. Pat. No. 5,999,325.

BACKGROUND OF THE INVENTION

This invention relates to an optical part or an optical device, and particularly to an optical part or an optical device having an optical material on which minute, generally spherical or aspherical convex or concave arcuate faces are formed and a process of producing the same. Further, the present invention relates to an optical device having an optical path of a great length such as, for example, a higher harmonic wave converting device and a short wavelength laser apparatus employing such optical device.

Conventionally, as a laser resonator, a laser resonator is known of the structure wherein a pair of concave reflecting mirrors are disposed in an opposing relationship to each other on the opposite sides of a laser medium. One of the reflecting mirrors is a total reflecting mirror while the other reflecting mirror is a mirror which passes part of laser light therethrough. In order to miniaturize such a laser system, it is necessary to make the spacing occupied by the reflecting mirrors as small as possible. Further, as miniaturization of systems proceeds, it is necessary to decrease the distance between the reflecting mirrors.

Meanwhile, non-linear optical devices are used which convert a frequency of light making use of a non-linear mutual action of light waves in a substance. The non-linear mutual action may be, for example, production of a second harmonic wave, optical parametric oscillation, production of a difference frequency or the like. Such an optical device is constituted from an optical resonator consisting of two such concave reflecting mirrors as described above, and an optical material in the form of non-linear optical crystal placed between the concave reflecting mirrors. A microlens, which is one of optical parts, is used for an optical communication system or optoelectronics. Since light emerging from a laser or an optical fiber spreads at the angle of 10 to 40 degrees or so, the microlens is used to convert such light into parallel light or further converge such light into a small spot. As one of methods of producing a microlens, there is a method wherein a mask pattern having a necessary circular opening is formed on a glass substrate using the technique of photolithography and ion exchanging is performed through the opening so that the refractive index of a portion of the glass substrate corresponding to the opening is made different from that of the other portion of the glass substrate.

While various optical devices are described so far, if such optical devices can be manufactured by forming a convex arcuate face integrally on an end face of an optical material, then this is very advantageous for miniaturization of an apparatus and so forth. By the way, if it is attempted to form a spherical or aspherical convex arcuate face on a surface of an optical material, one of most popular methods is a method by polishing. Accordingly, it is possible to work only one or several works, and consequently, optical devices cannot be manufactured in a mass at a low cost. Further, where such polishing is involved, there is a problem that, from a physical restriction, a plurality of convex arcuate faces cannot be formed in the proximity of each other on a surface of an optical material. A Fresnel lens is known as an example of an aggregate of small lenses. In this instance, since an electron beam picture drawing apparatus is employed for production of a Fresnel lens, the equipment is very expensive and the mass productivity is low. Further, while it is possible to manufacture, by molding, a microlens on which a plurality of convex arcuate faces are provided, the material of the microlens is limited to such material that is suitable for molding. Accordingly, there is a problem that it is impossible to manufacture a microlens using such a material as a single crystal material or a high melting point amorphous material.

By the way, since generally a laser is limited in output wavelength, there is a method wherein laser light is converted into coherent light of another wavelength making use of a non-linear optical phenomenon in order to obtain laser light of a shorter wavelength. As a representative example of the same, there is a method wherein laser light is converted into a higher harmonic wave by means of a higher harmonic wave generator (SHG). This depends upon the fact that, if laser light of a frequency $\omega_o$ is introduced into crystal of a non-linear medium, then light of the frequency $2\omega_o$ is outputted from the crystal. Such higher harmonic conversion has been attempted in accordance with various methods, and it is known that a higher harmonic output thus converted increases in proportion to an input power to the second power or an internal power to the second power of a resonator and a length to the second power of the non-linear medium (however, at an optimum focus, the higher harmonic wave output increases in proportion to a length of the non-linear medium). Accordingly, in order to increase the higher harmonic wave output, it is necessary to, increase the internal power or the length of the non-linear medium.

As a method for higher harmonic conversion which is conventionally employed, there is a method of direct conversion wherein non-linear crystal is cut into a piece, and low reflection coatings are applied to the polished opposite end faces of the non-linear crystal piece, and then exciting light is irradiated upon the non-linear crystal piece. With the present method, direct conversion making use of a semiconductor laser is possible, but since generally it is difficult to obtain a long non-linear crystal piece, there is a problem that the available higher harmonic wave output is very low. Further, there is another method wherein a non-linear medium is disposed in a laser resonator. With the present method, since the internal power of the resonator can be made equal to 100 times or so the intensity of incidence light readily, a comparatively high higher harmonic output can be extracted. However, there are problems that the system is complicated and that a separate modulator is required because direct modulation by the semiconductor laser is not performed. Further, as a method which efficiently raises the incidence power and artificially satisfies a phase matching requirement, there is a method wherein exciting light is enclosed by means of a waveguide structure to effect higher harmonic conversion. The method, however, has problems that technical difficulty is involved in production of the waveguide and besides that it is very difficult to introduce exciting light into the waveguide and efficiently extract a higher harmonic wave from the waveguide. Also, there is a problem that, since it is difficult, from a restriction in manufacture, to obtain a symmetrical structure with respect to an optical axis and consequently it is actually difficult to extract a higher harmonic wave of a single mode, it is limited in application.

As described so far, with the methods proposed till now, the output is too low, and if the case is considered wherein an optical device is used as a light source, for example, for an optical disk, then the situation is such that it is difficult to provide a light source device which has a higher harmonic wave output of 1 mW or so and can effect simple modulation.

By the way, a solid-state laser which is longitudinally excited by a laser diode can present a high gain due to a wide spectrum and pumping having a spatial characteristic. Various laser devices of the high output type (including multi-facet pumping devices, LD multiplexing devices and fiber bundle pumping devices) have been developed till now. However, in order to scale up the longitudinal excitation to increase the output power, generally it is necessary to make a cavity large so that the laser device may stand a higher basic mode. Further, if the longitudinal excitation is scaled up, then the gain is decreased due to double refraction or aberration which is caused by heat.

On the other hand, as a method for scaling up the longitudinal excitation while keeping the cavity compact, there is a method wherein, making use of a thermal lens effect which is caused by exciting light introduced into a solid-state laser medium, a pair of flat mirrors are disposed on the laser medium so that multi-array excitation may take place (Oka, M. et at. CLEO '91, p.40). However, this method has problems that, since it makes use of a thermal lens effect, the threshold level in laser oscillation is high and the oscillation efficiency is low.

SUMMARY OF THE INVENTION

1. Optical Device of the Invention

In the present invention, an optical device which has an optical material having a convex arcuate face or a concave arcuate face formed on a surface thereof includes not only an optical device which includes, as one of components thereof, an optical material which has a convex arcuate face or a concave arcuate face formed on a surface thereof, but also an optical device which is constituted only from an optical material which has a convex arcuate face or a concave arcuate face formed on a surface thereof.

Such an optical device is, for example, a laser array or a microlens or the like which has an optical material which has, for example, a plurality of concave or convex arcuate faces formed on a surface thereof.

Further, an optical device can be listed wherein, as shown in FIG. 7, a convex arcuate face is formed integrally on one of a pair of end faces of a laser medium or a non-linear optical material while the other end face of the laser medium or the non-linear optical material is formed as a flat face. In this instance, a total reflecting mirror or a semi-transmitting film may be coated on one or both of the convex arcuate face and the flat face of the laser medium or the non-linear optical material. It is to be noted that, while the other end face of the laser medium or the non-liner optical material extends in parallel to the one end face in FIG. 7, in the case of an optical device of the ring laser type (optical device of the type wherein a polygonal optical path is formed in the material), the other end face may be inclined with respect to the one end face as shown in (b) of FIG. 18.

Junction type laser resonators shown in FIGS. 12 and 13 can be constructed using such an optical device. In FIGS. 12 and 13, reference numeral 13 denotes a total reflecting film for light, and 14 a semi-transmitting film for light.

Further, the present invention provides an optical device which is characterized in that, as shown in FIG. 6, a first convex arcuate face is formed integrally on an end face of a laser medium while a second convex arcuate face is formed integrally on the other end face of the laser medium, and a total reflecting film which totally reflects laser light is provided on the first convex arcuate face while a semi-transmitting which reflects part of laser light and transmits part of the laser light therethrough is formed on the second convex arcuate face, thereby to constitute a laser resonatoor Such an optical device constitutes a laser resonator in a laser apparatus of the arcay type which will be hereinafter described.

Further, as described in the section of "3. Optical Device Having Zigzag Optical Path" hereinafter described, the present invention provides an optical device characterized in that it is composed of a light transmitting optical material having a first face and a second face opposing to each other and has a plurality of first reflecting portions provided on the first face and a plurality of second faces provided on the second faces individually in an opposing relationship to the first reflecting portions and besides has a zigzag optical path which is provided between the first reflecting portions and the second reflecting portions and alternately couple the first reflecting portions and the second reflecting portions to each other, and each of at least ones of the first reflecting portions and the second reflecting portions is a reflecting portion formed by coating a reflecting film on a convex arcuate face. The present invention further provides a short wavelength laser apparatus which employs such optical device.

Preferably, the convex arcuate face or concave arcuate face is a generally spherical face or aspherical face, for example, a face of an ellipsoid of revolution. In this instance, the spherical face or aspherical face may have distortion wherein the radius of curvature in a radial direction varies continuously or stepwise.

A first method of forming at least one convex arcuate face or concave arcuate face on a surface of an optical material is achieved by a method characterized in that at least one convex arcuate face or concave arcuate face is formed by photolithography on a photoresist film formed on a surface of the optical material, and the surface of the optical material and the photoresist film are etched to form, on the surface of the optical material, at least one convex arcuate face or concave arcuate face similar to the convex arcuate face or concave arcuate face of the photoresist film.

Here, as a first method of forming a convex arcuate face or concave arcuate face by photolithography, a method is first listed wherein, at the exposing step of exposing the photoresist film to light of a circular or elliptic pattern, the intensity of the exposure light is gradually varied from the center to an outer periphery of the pattern.

Here, to gradually vary the intensity of the exposure light from the center to an outer periphery of the pattern includes a case wherein the color is white (transparent) at the center and becomes dark (opaque) toward an outer periphery and another case reverse to this.

As such method, for example, the following methods can be listed.

(1) A method wherein, using a lens having a low resolution such as an enlarger for a photograph film as an exposure lens, light of a circular or elliptic pattern of a photomask is focused on a photoresist film to effect exposure of the photoresist film and then the photoresist film is developed.

(2) A method wherein a circular or elliptic pattern to be formed on a photoresist film is focused in a fully defocused condition on a photoresist film to effect exposure of the photoresist film and then the photoresist film is developed.

(3) A method wherein, when a photoresist film is to be exposed to light using a photomask having a pattern formed thereon, a white or black circular or elliptic shape is photographed in a somewhat defocused condition to obtain a negative film having a circular or elliptic pattern which varies in photographic density from a central portion to an outer periphery thereof, and using the negative film as a negative for transfer of a circular or elliptic pattern, an image of the negative film is formed on a photoresist film or a photoresist film is exposed to light in a condition wherein the negative is positioned in the proximity of or in close contact with the photoresist film, whereafter the photoresist film is developed.

(4) A method wherein a diffuser is inserted intermediately of an optical system for exposure to obtain diffused light, and an image of a pattern to be formed is formed on a photoresist film with the diffused light to effect exposure of the photoresist film, whereafter the photoresist film is developed.

A diffuser is an optical element which is obtained by sand-blasting a surface of an optical glass element such as BK-7 using abrasive grain of alumina and diffuses light, and, for example, DFSQ-50C02-1500 produced by Siguma Koki and so forth can be listed as such.

(5) A method wherein a photoresist is exposed to light in a condition wherein a photomask on which a pattern is formed is spaced away from the photoresist film so as to provide a distance between them and then the photoresist is developed.

(6) Either of a convex arcuate face and a concave arcuate face can be formed depending upon whether the pattern of the photomask is black or white in any of the methods (1) to (5) described above.

Further, as a second process of the present invention, there is a method characterized in that a photoresist film of a circular column-shaped or elliptic column-shaped pattern is formed by exposure based on photolithography and development on a photoresist film formed on a surface of an optical material and having a generally flat and smooth upper end face, and the photoresist film is heat treated to deform the generally flat upper end face of the photoresist film into a convex arcuate face, and then the surface of the optical material and thus deformed photoresist film are etched to form at least one convex arcuate face similar to the convex arcuate face of the photoresist film on the surface of the optical material.

In other words, if a photoresist film is exposed to light using a photomask having a circular or elliptic pattern formed thereon and is then developed, then if focusing upon exposure is appropriate. then a circular column-shaped photoresist film having a generally flat and smooth upper end face is formed on the surface of the optical material. Thus, if the circular column-shaped or elliptic column-shaped photoresist film is held at a temperature higher than a glass transition point of the material constituting the circular column-shaped or elliptic column-shaped photoresist film so that the photoresist film may be fluidized by heat, then an upper end corner portion of the circular column-shaped or elliptic column-shaped photoresist film is deformed round until the circular column-shaped or elliptic column-shaped photoresist film is rounded by its surface tension and is deformed into a convex arcuate face as a whole.

In the foregoing, preferably etching is performed by dry etching. Gas to be used in etching can be determined suitably depending upon an optical material employed. Conditions of etching depend upon a profile of a convex arcuate face or a concave arcuate face to be formed on a surface of an optical material. In the case of dry etching, some distortion can be provided to the convex arcuate face or concave arcuate face by changing the sectional shape of the convex arcuate face or concave arcuate face to be formed on the surface of the optical material (the sectional shape in a direction perpendicular to the surface of the optical material) by continuously or stepwise changing, at any time during etching, the kind, amount or flow rate of gas used, the high frequency output. the intensity of a magnetic field for enclosure, the accelerating voltage for gas ions, the etching time or the like.

It is to be noted that, in the case of an optical device wherein laser light is reflected by an upper face, a lower face or the like in a material in order to form many optical paths in the inside of the material such as a ring laser, preferably the face is made a fault-free mirror face in order to obtain a high reflection factor. As hereinafter described, in the present invention, when an optical material which has only one lens (convex arcuate face or concave arcuate face) on a surface (one end face) thereof is to be manufactured, a method is employed wherein, for example, a plurality of convex arcuate faces are first formed on the optical material and then the optical material is cut along a border around each of the convex arcuate faces. In this instance, since a cut face makes, with an optical device of the ring laser type, a reflecting face for light, it is necessary to polish it into a mirror face by means of polishing abrasive grain or the like. However, a mirror face obtained by polishing by means of abrasive grain is not free from a fault but has fine faults caused by the abrasive grain. Since such faults deteriorate the reflection factor for laser light, according to the present invention, faults on a polished face are removed in the following method. First, a photoresist film is formed on a faulty polished face similarly as the case of a convex arcuate face or a concave arcuate face, and then dry etching is performed for the photoresist film and the optical material until the faults disappear. While, in the case of an optical device of the ring laser type, if an upper face or a lower face (or side face) is not a cut face, it is necessary to polish a face serving as a reflecting face (except a coated face) into a mirror face, also in this instance, a fault-free mirror face can be obtained by applying the fault removing method described above.

An action of an arcuate face being formed on an optical material in such a manner as described above will be described. First, describing the case wherein a convex arcuate face is formed, a photoresist film having a convex arcuate face is formed on a surface of an optical material on which a convex arcuate face is to be formed. By etching, the optical material which is not covered with the phGtoresist film begins to be etched immediately. The photoresist film before etching has the convex arcuate face, and accordingly, the thickness of the photoresist film becomes greater toward a central portion of the same.

Therefore, a peripheral portion of the photoresist film is etched earlier than a central portion of the photoresist film, and accordingly, the optical material positioned below such peripheral portion is etched earlier and by a higher rate than the optical material positioned below the central portion.

As a result, a convex arcuate face similar to the convex arcuate face of the photoresist film is formed on the surface of the optical material. In this instance, if etching is performed by dry etching and conditions of the dry etching are varied continuously or stepwise at any time during etching, then a convex arcuate face having some distortion is formed. When an optical material having only one lens integrally at an end face thereof is to be manufactured, a method can be listed wherein a plurality of convex arcuate faces are first formed on an optical material and then the optical material is cut along a boundary around each of the convex arcuate faces. When there is the necessity of making a cut face a mirror face, if the cut face is polished into a mirror face by means of polishing abrasive grain or the like and then a photoresist film is formed on the polished face and then dry etched, also the cut face is etched uniformly, subsequently to the photoresist film, so that a fault-free mirror face is formed.

When a concave arcuate face is to be formed, the thickness and so forth of a photoresist film are reverse to those of the case of a convex arcuate face.

In the present specification, an optical device signifies any of a laser resonator, a monolithic laser system, a non-linear optical device, a microlens, a ring laser, an optical device having a zigzag optical path, which will be hereinafter described, and so forth.

In case the optical device is a laser resonator, the optical material is composed of a laser material and a surface of the optical device on which a convex arcuate face is formed is an end face which reflects at least part of laser light.

In case the optical device is a plurality of laser resonators disposed in an array, the optical material is composed of a laser material and a surface of the optical material on which a plurality of convex arcuate faces are formed is an end face which reflects at least part of laser light.

In case the optical device is a non-linear optical device (which may be of the type similar to a ring laser), the optical material is composed of a non-linear crystal material and a surface of the optical material is an end face which has one or a plurality of convex arcuate faces formed thereon and reflects at least part of laser light. The other end face of the optical material extends in parallel or In an inclined relationship to the surface (one end face) of the optical material.

In case the optical device is a microlens, the optical material is composed of an amorphous material such as glass or a crystal material such as quartz and one or a plurality of convex arcuate faces are formed on a surface of the optical material.

As the optical material, laser materias such as Nd:YAG, Nd:YAB, Nd:$Y_3Al_5O_{12}$, Nd:YLiF$_4$, Nd:YVO$_4$, Nd:La$_2$Be$_2$O$_5$ and Nd:Y$_3$Al$_5$(BO$_3$), non-linear materials such as KNbO$_3$, LiNbO$_3$ and KTiOPO$_4$, amorphous materials such as BK7, composite quartz and glass and crystal materials such as quartz, calcite, silcon and GaAs can be listed.

As a photoresist, preferably a photoresist obtained by polymerization of a diazo photosensitive material with a phenol resin generally called positive type photoresist is employed.

It is to be noted that a convex arcuate face in the present invention includes an independent convex face and two or more convex faces which partially connect to each other. A concave arcuate face in the present invention includes an independent concave face and two or more concave faces which partially connect to each other.

According to the present invention, a large number of very small, generally spherical or aspherical convex arcuate faces or concave arcuate faces can be formed collectively on a surface of an optical material, and further, a plurality of convex arcuate faces or concave arcuate faces can be formed in the proximity of each other. Accordingly, a novel optical device such as a very small solid-state laser, a ring laser, a solid-state laser of the array arrangement, a microlens or a non-linear optical device which has a very small solid-state element which was not able to be manufactured by conventional polishing can be manufactured readily in a mass at a low cost. Further, it is possible for the spherical face or aspherical face to have arbitrary distortion in accordance with the necessity. Further, the reflection factor of a face for which polishing into a mirror face has been performed can be enhanced by removing faults after polishing.

2. Array-Type Laser Apparatus Employing Optical Device Having Convex Arcuate Face An optical device wherein a plurality of convex arcuate faces are formed on a laser medium can be used as a laser resonator in order to constitute an efficient multi-array type laser. In particular, an array type laser apparatus can be provided which is characterized in that it comprises plurality of exciting sources for laser oscillation, and a laser resonators wherein a plurality of convex arcuate faces are formed on at least one end face of a solid-state laser medium and each of at least ones of the convex arcuate faces and other end end faces of the solid-state laser medium opposing to the convex arcuate faces is coated with a reflecting film.

A plurality of exciting light beams outputted from the exciting sources are introduced into the plurality of convex arcuate faces formed on the end face of the solid-state laser medium. The exciting light beams introduced into the laser medium through the convex end faces are repetitively reflected by the coatings applied to the opposing face and the face through which the exciting light beams are introduced. In this instance, each of the convex arcuate faces acts as a concave reflecting mirror, and the laser medium itself functions as a stable type laser resonator so that multi-array type oscillation occurs.

Normally, as stable type laser resonators, a stable type laser resonator of the structure wherein a pair of concave reflecting mirrors are disposed in an opposing relationship to each other on the opposite sides of a laser medium and another stable type laser resonator of the structure wherein a concave reflecting mirror is disposed on one side of a laser medium and a flat mirror is disposed on the other side of the laser medium in an opposing relationship to the concave reflecting mirror are known. One of the reflecting mirrors is a total reflecting mirror, and the other reflecting mirror is a reflecting mirror which passes part of laser light therethrough.

In order to miniaturize such a laser system, it is necessary to minimize the spacing occupied by the reflecting mirror. Further, as the miniaturization of a system proceeds, the distance between the reflecting mirrors must necessarily be reduced.

If a laser resonator can be manufactured by forming a convex arcuate face integrally on a solid-state laser medium, then this is very effective for miniaturization of an apparatus and particularly advantageous for a high density array type laser.

If the opposite end faces of a laser medium wherein a convex arcuate face is formed on one or both of the opposite end faces in such a manner as described above are each coated with a film which reflects light, then the laser medium can function as a laser resonator. The side of the laser medium into which exciting light is introduced is provided with such a coating that transmits exciting light therethrough but reflects almost all of laser light emitted from the solid-state laser medium, and the output side of laser light is provided with such a coating that reflects almost all of exciting light but transmits part of amplified laser light therethrough.

As a method for such coating, a method wherein two kinds of thin films having different refractive indexes are layered, by vacuum deposition or sputtering, alternately to such thicknesses with which the respective optical lengths at an aimed reflecting wavelength correspond to the ½ wavelength can be listed.

While a krypton arc lamp, a xenon flash lamp or the like can be used as an exciting source for the laser resonator, a semiconductor laser is preferable from the point of view of reduction in power, enhancement in efficiency, miniaturization and so forth. Particularly, as an exciting source for an array type laser, it is preferable for the object of simplification of an apparatus to employ a semiconductor laser of the multi-stripe type which outputs a plurality of laser beams, for example, a laser diode of the multi-stripe type.

In this manner, if an exciting source which emits a plurality of laser beams is employed, then it is only necessary to form convex arcuate faces on an end face of a laser medium corresponding to such plurality of laser beams, and accordingly, construction of an apparatus can be simplified remarkably.

However, even a laser apparatus which outputs a single laser beam such as a krypton arc lamp, a xenon flash lamp or a semiconductor laser of the single type can be employed as the exciting source described above in the present invention, and in this instance, an optical fiber for guiding a laser beam outputted from each of the laser apparatus may be such that it is inputted to a corresponding one of the convex arcuate faces.

The wavelength of the exciting light source must necessarily coincide with or be in the proximity of an absorption spectrum of the laser medium. In case a laser diode is employed as the exciting source, for example, if a laser diode which oscillates in the proximity of an absorption wavelength of the laser medium and then the temperature is varied so that the absorption may be maximum to effect tuning, then the wavelength of the exciting light source can be made coincide with the absorption spectrum of the laser medium. In case Nd:YAG is employed as the laser medium, a GaAlAs semiconductor laser can be listed as a preferable exciting source.

A laser apparatus of the array type of the present invention is constituted by disposing a solid-state laser resonator and an exciting source such that exciting light may be converged to a convex arcuate face formed on the solid-state laser resonator. Since exciting light outputted from an exciting source is emitted normally with a fixed angle, when a plurality of laser beams emitted from individual active waveguides of a laser diode of the multi-stripe type are to be introduced into the individual convex arcuate faces formed on the surface of the solid-state laser medium, a focusing lens may be interposed in accordance with the necessity. The plurality of laser beams are converted into parallel beams of light or converged into a spot by the focusing lens so that they are converged to the individual convex arcuate faces formed on the surface of the solid-state laser medium. Consequently, they are introduced into the inside of the laser medium through the convex arcuate faces.

3. Optical Device having Zigzag Optical Path

Of the optical devices described hereinabove, the optical device which is characterized in that, as shown in FIGS. 20 to 22, it is formed from a light transmitting optical material having a first face and a second face opposing to each other and has a plurality of first reflecting portions provided on the first face and a plurality of second reflecting portions provided on the second face individually in an opposing relationship to the first reflecting portions and further has a zigzag optical path which is provided between the first reflecting portions and the second reflecting portions and alternately couples the first reflecting portions and the second reflecting portions to each other, and each of at least ones of the first reflecting portions and the second reflecting portions is a reflecting portion formed by coating a reflecting film on a convex arcuate face, has an optical path of a great length and can be used, for example, as a higher harmonic converting device.

A window for passing light therethrough is provided at each of an end portion of the first face and an opposite end portion of the second face. One of the windows will be hereinafter referred to as incidence window, and the other will be hereinafter referred as outputting window. Light introduced into the light transmitting optical material through the incidence window passes the zigzag optical path described above and outputs through the output window. The input window and the output window may be provided at the opposite end portions of one of the faces (FIG. 24).

As an optical device having a zigzag optical path, an optical device can be listed wherein a convex arcuate face is formed on a first one of a pair of opposing faces of a light transmitting optical material and the second face is formed as a flat face as shown in FIGS. 20 and 21. Further, such junction type devices as shown in FIGS. 27 and 28 can be listed. Further, a higher harmonic wave converting device can be listed which is characterized in that, as shown in FIG. 22, a first convex art face is provided on one of a pair of opposing faces of a light transmitting optical material while a second convex arcuate face is provided on the other face, and coatings are provided on both faces and a window is formed at an end portion of each of the faces.

Preferably, each of the convex arcuate faces is a generally spherical face or aspherical face, for example, a face of an ellipsoid of revolution. In this instance, the spherical face or aspherical face may have distortion wherein the radius of curvature varies continuously or stepwise in a radial direction.

Upon formation of the convex arcuate faces, the error in formation of the convex arcuate faces can be corrected by making a plurality of sets of convex arcuate faces having radii of curvature which are different by a small amount from each other, effecting laser oscillation or higher harmonic conversion using a laser oscillator and selecting a set of convex arcuate faces with which the oscillation efficiency or the higher harmonic conversion efficiency is the highest. The diameter, the radius of curvature and so forth of the convex arcuate faces are suitably set depending upon an object of use, a wavelength and so forth of the optical device. Formation of the convex arcuate faces may be performed similarly as described hereinabove.

While the first reflecting portions and the second reflecting portions described above are constructed, preferably for the maintenance of a light converging condition and the enhancement of the power intensity of the inside, such that a convex arcuate face such as a spherical case is formed at least on one face and part or all of a reflecting portion is formed from a reflecting mirror provided by the convex arcuate face (FIGS. 20 to 22), the two reflecting portions may be in the form of flat faces (FIGS. 23 to 25). Further, a prism may be provided as a reflecting portion in place of a convex arcuate face (FIG. 26). In order to form a prism on an optical material, at an exposing step wherein a photoresist film is exposed to light of a circular or elliptic pattern in the photolithography method described above, the distribution of the exposure light intensity should be varied in accordance with a profile of the prism.

The reflecting portions and windows can be formed by coating a total reflecting film for light on a surface of a light transmitting optical material at locations at which the respective reflecting portions are to be provided while no coating is provided at locations at which the windows are to be provided (FIGS. 20, 25 and etc.). Or else, they can be formed by coating a total reflecting film for light on an entire face of each of the first and second faces and then removing the coatings at locations of the windows. Further, coating may be performed only for each of the reflecting portions (FIGS. 23 and 24).

As a method of such coating, a method wherein two kinds of thin films having different refractive indexes are layered, by vacuum vapor deposition or sputtering, alternately to such thicknesses with which the optical lengths at an aimed reflecting wavelength correspond to the ½ wavelength can be listed.

As a method of removing the coatings, a method wherein coating is performed in a condition wherein, for example, a photoresist film is formed at each window portion and the coatings are removed together with the photoresist film or another method wherein a photoresist film is formed after application of a coating and then exposure and development are performed to remove the photoresist at each window portion, whereafter the exposed coating is removed by dry etching, can be listed.

Subsequently, an example of coating and formation of an incidence window and an output window will be described in detail.

Photoresist is spin coated on a surface of a light transmitting optical material, and pre-baking is performed to form a photoresist film. Subsequently, a photomask having a circular light intercepting pattern is closely contacted with a surface of the photoresist and ultraviolet rays are irradiated upon the photoresist film to effect close contact exposure of the photoresist film. The photoresist film exposed to ultraviolet rays is developed and then rinsed with pure water, whereafter it is dried. The photoresist film is first dried for 30 minutes in a clean oven at 100° C. and then, post-baking is performed for an hour in another clean oven at 175° C. Dry etching of the light transmitting optical material Wherein a convex arcuate face is made of the photoresist in this manner is performed using a dry etching equipment to transfer the convex arcuate face made of the photoresist to the surface of the light transmitting optical material.

Coating on the surface and formation of a window in the light transmitting optical material on which the convex arcuate face or no convex arcuate face is formed in this manner is performed, for example, in the following manner. Prior to coating, photoresist is spin coated on the surface of the light transmitting optical material and pre-baking is performed to form a photoresist film, and then the photoresist is left only at each window portion by close contact exposure and developing processing. In this condition, $TiO_2$ and $SiO_2$ are alternately vapor deposited by an electron beam by means of an electron beam vapor depositing apparatus. Preferably, a coated film is such a film that reflects almost all of light of frequencies between a basic wave and a higher harmonic wave. After the specimen is taken out of the vapor depositing apparatus, it is soaked in acetone and washed using an ultrasonic washing machine to remove the photoresist and the coated film deposited on the photoresist film to form a window. Further, formation,of a window is possible not only by the so-called lift-off method described above but also by etching. A method can be listed wherein, after coating is performed, spin coating and pre-baking are performed for the photoresist to form a photoresist film, whereafter exposure, development and water washing are performed using a photomask to expose the window portion through the photoresist film, and then, part or all of the coated film is removed by dry etching to form a window. If coating for prevention of reflection is performed after formation of the window portion, then an element of a further high performance can be manufactured.

Light introduced into the incidence window of the optical device obtained in this manner is repetitively reflected alternately by the two reflecting portions such that it advances in a zigzag pattern and then outputs through the output window. Since, due to such an action, it is possible to assure a great optical path length and a beam can be successively converged by a light converging effect of the concave mirrors, the optical device can be utilized as a higher harmonic wave converting device for light, a laser oscillator such as a slab laser and so forth.

As the light transmitting optical material for use for an optical device having such a great optical path length, laser materials such as Nd:YAG, Nd:YAB, $Nd:Y_3Al_5O_{12}$, $Nd:YLiF_4$, $Nd:YVO_4$, $Nd:La_2Be_2O_5$ and $Nd:Y_3Al_3(BO_3)_4$, non-linear materials such as $KNbO_3$, $LiNbO_3$ and $KTiOPO_4$ and amorphous materials such as BK7, composite quartz and glass can be listed.

Upon production of an optical device of the present invention, a plurality of optical devices can be produced readily at a low cost by cutting a light transmitting optical material after a plurality of sets of convex arcuate faces and windows are formed collectively.

4. Short Wavelength Laser Apparatus Employing Device Having Zigzag Optical Path

A short wavelength laser apparatus can be constructed by using a non-linear optical device on which reflecting portions and windows are formed in such a manner as described above as a higher harmonic wave converting device and disposing the higher harmonic wave converting device and an exciting laser oscillator such that laser light may be converged to one of the windows formed on the higher harmonic wave converting device.

Since laser light outputted from a laser oscillator is emitted normally with a fixed angle, it is preferable to convert the laser light into parallel light or converge the same into a spot using a focusing lens in accordance with the necessity. Laser light outputted from the exciting laser oscillator is converted into parallel light or converged into a spot by the focusing lens so that it is converged as a basic wave into the incidence window of the higher harmonic wave converting device. The fundamental wave is introduced into the higher harmonic wave converting device through the incidence window and then repetitively reflected by the two reflecting portions of the higher harmonic wave converting device so that it is added into a higher harmonic, and finally, the basic wave and higher harmonic wave are outputted from the output window.

Further, by employing a laser diode as the laser oscillator, a short wavelength laser apparatus which is small in size, simple and convenient and can effect direct modulation can be constructed.

BRIEF DESCRIPTION OF THE DRAWINGS

FIGS. 2*a*–2*d* are schematic diagrammatic views showing different steps of another example of manufacturing method for an optical device of the present invention;

FIGS. 3a–3d are schematic diagrammatic views showing different steps of a further example of manufacturing method for an optical device of the present invention;

FIGS. 4a–4e are schematic diagrammatic views showing different steps of a still further example of manufacturing method for an optical device of the present invention;

DESCRIPTION OF THE PREFERRED EMBODIMENTS

Figure 5:
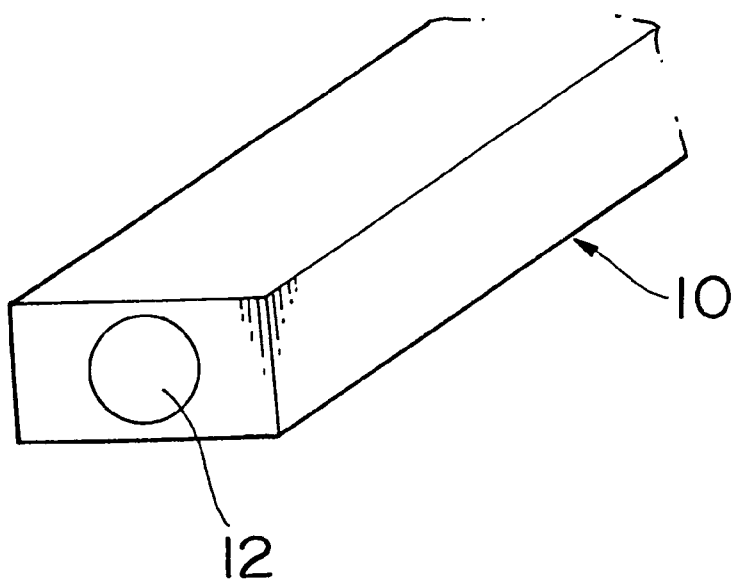
FIG. 5 is a perspective view of a laser medium on which a convex arcuate face is formed.
Figure 6:
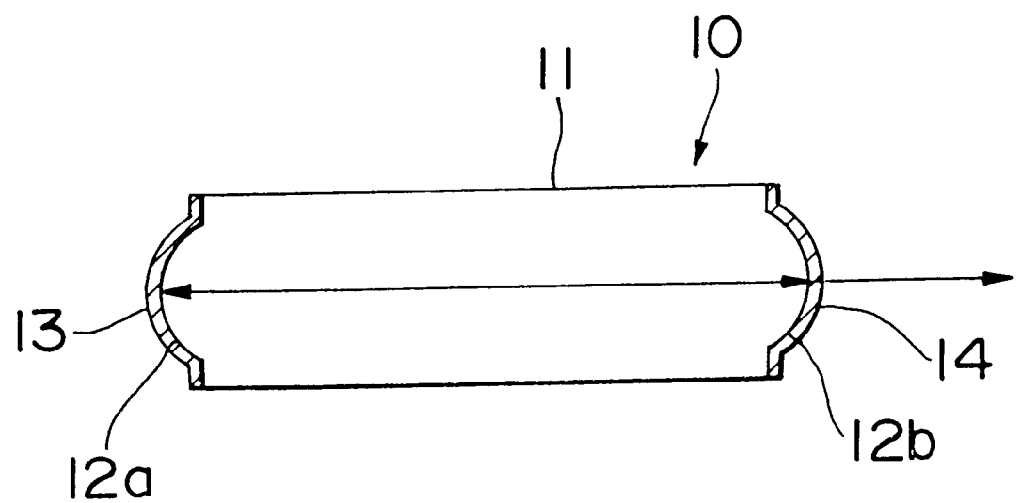
FIG. 6 is a sectional view of a laser resonator wherein a convex arcuate face is formed integrally on each of the opposite faces of a laser medium.
Figure 7:
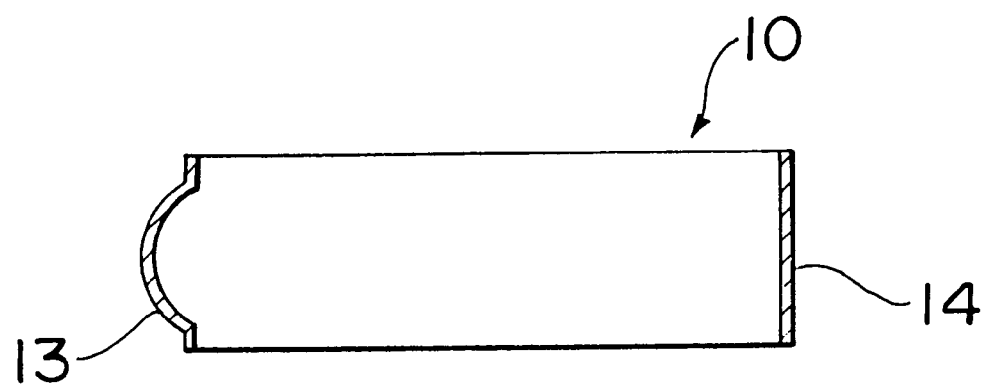
FIG. 7 is a sectional view of another laser resonator wherein a convex arcuate face is formed integrally on an end face of a laser medium.

Part of an example of optical device of the present invention is shown in perspective view in FIG. 5. Referring to FIG. 5, reference numeral 10 denotes a laser resonator, and 12 a generally spherical convex arcuate face formed on an end face of the laser resonator 10. The laser resonator 10 is constructed such that, as shown in FIG. 6, a first convex arcuate face 12a is formed integrally on an end face of a laser medium 11 while a second convex arcuate face 12b is formed integrally on the other end face of the laser medium 11, and a total reflecting film 13 which totally reflects laser light is provided on the first convex arcuate face 12a while a semi-transmitting film 14 which reflects part of laser light but transmits part of the laser light therethrough is formed on the second convex arcuate face 12b. The present construction is common not only to laser oscillators but also to non-linear optical devices.

Figure 8:
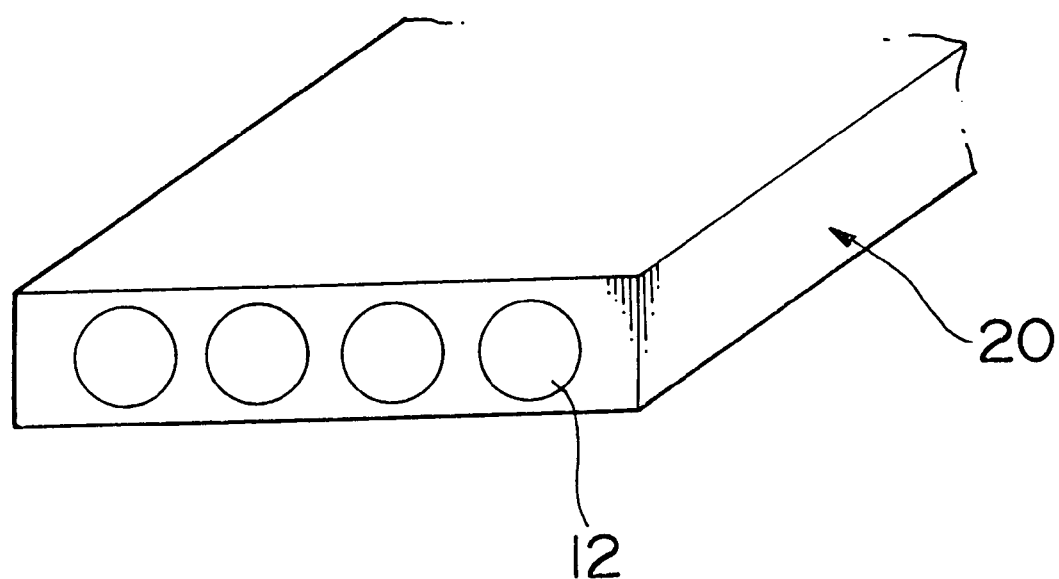
FIG. 8 is a perspective view of an optical device.
Figure 9:
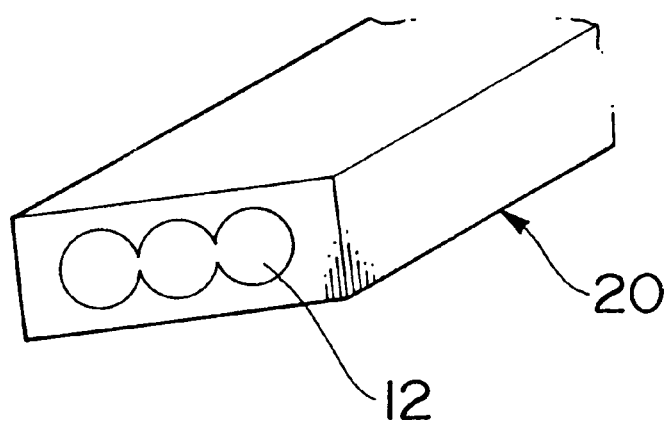
FIG. 9 is a perspective view of another optical device.

Part of another example of optical device of the present invention is shown in perspective view in FIG. 8. Referring to FIG. 8, reference numeral 20 denotes an optical device, and 12 a generally spherical convex arcuate face. A plurality of such generally spherical convex arcuate faces 12 are formed on an end face of the optical device 20. FIG. 9 shows a modified arrangement wherein a plurality of convex arcuate faces 12 are connected to each other.

Figure 10:
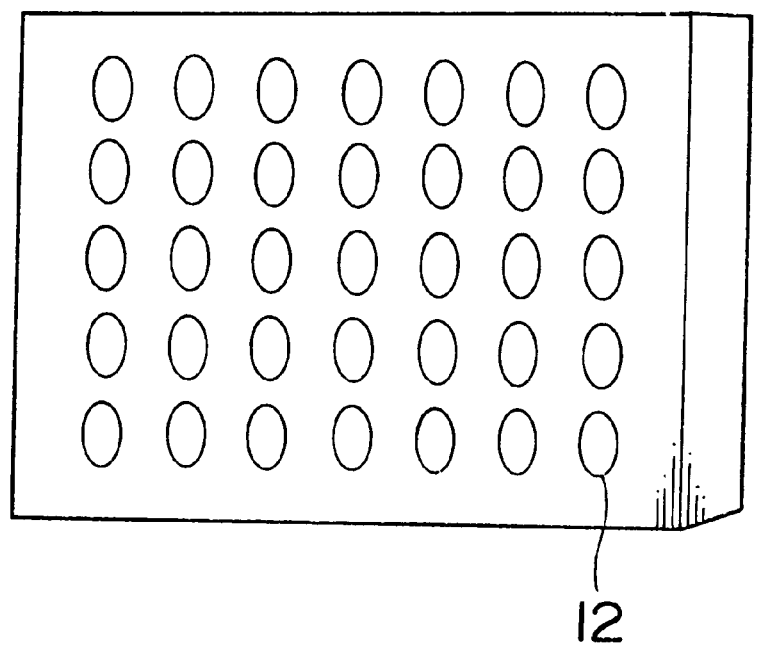
FIG. 10 is a perspective view of a microlens.
Figure 11:
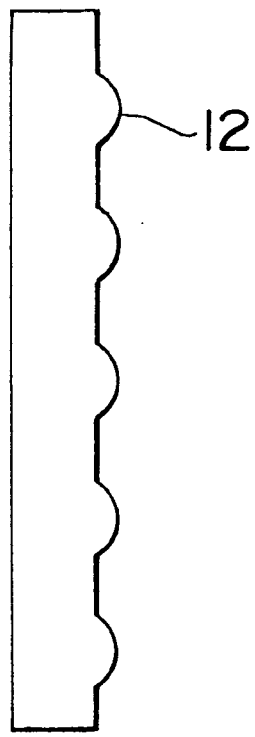
FIG. 11 is a sectional view of the microlens.
Figure 12:
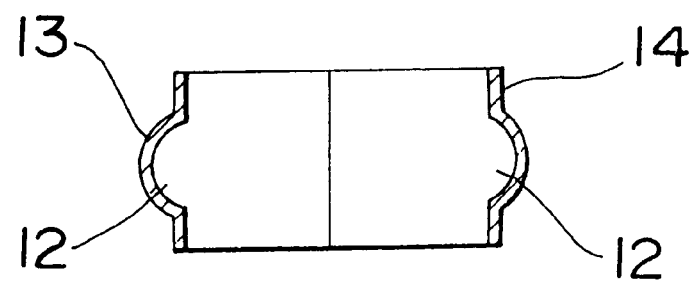
FIG. 12 is a sectional view of an example of two-material Junction type laser resonator wherein a convex arcuate face is formed on each of the opposite end faces.
Figure 13:
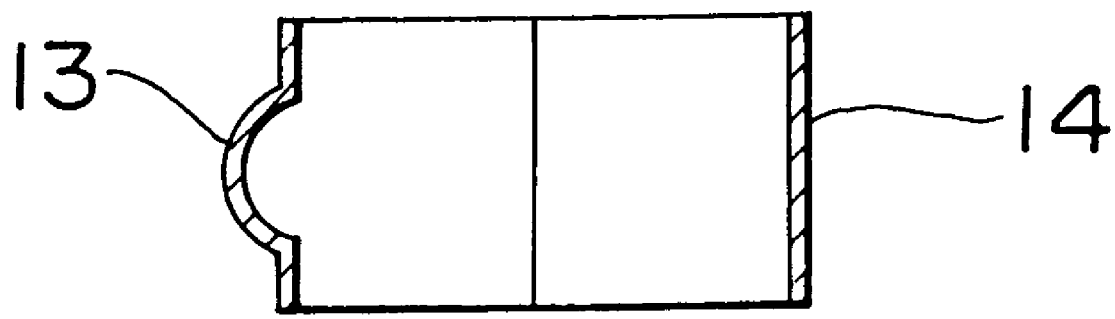
FIG. 13 is a sectional view of another example of two-material Junction type laser resonator wherein a convex arcuate face is formed on an end face.

A further example of optical device of the present invention is shown in sectional view in FIGS. 11 and 12. Referring to FIGS. 10 and 11, reference numeral 12 denotes a generally spherical convex arcuate face. A plurality of such generally spherical convex arcuate faces 12 are provided and constitute a microlens.

Figure 30:
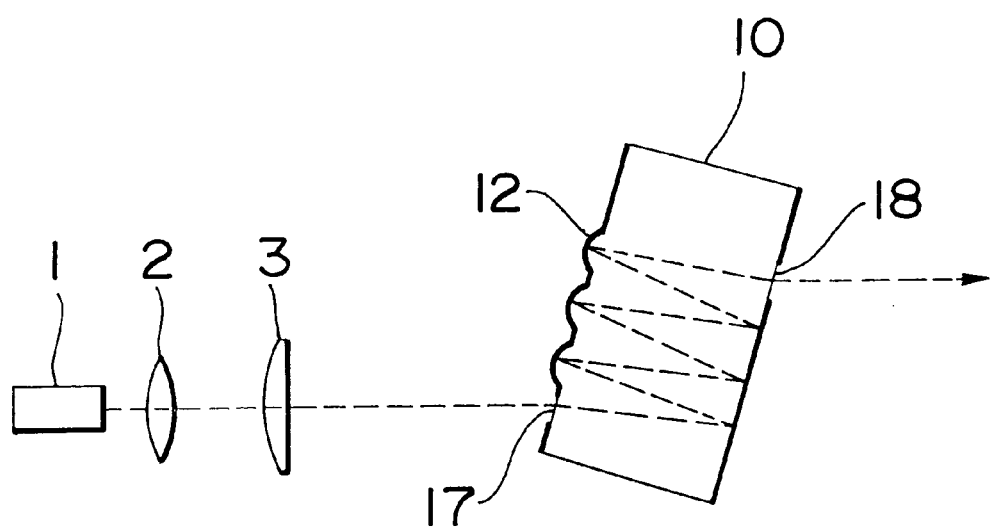
FIG. 30 is a schematic view showing an example of short wavelength laser apparatus which employs an optical device of the present invention.

Sectional views of an optical device having a zigzag optical path of the present invention are shown in FIGS. 20 to 28. A short wavelength laser apparatus which employs such an optical device as a higher harmonic wave converting device is shown in FIG. 30.

Figure 31:
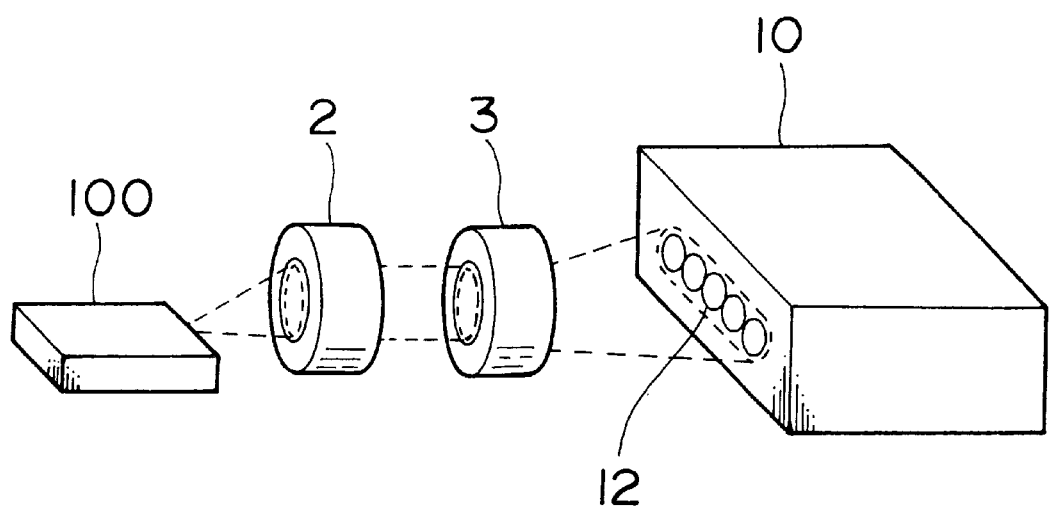
FIG. 31 is a schematic view showing an example of laser apparatus of the array type of the present invention.
Figure 32:
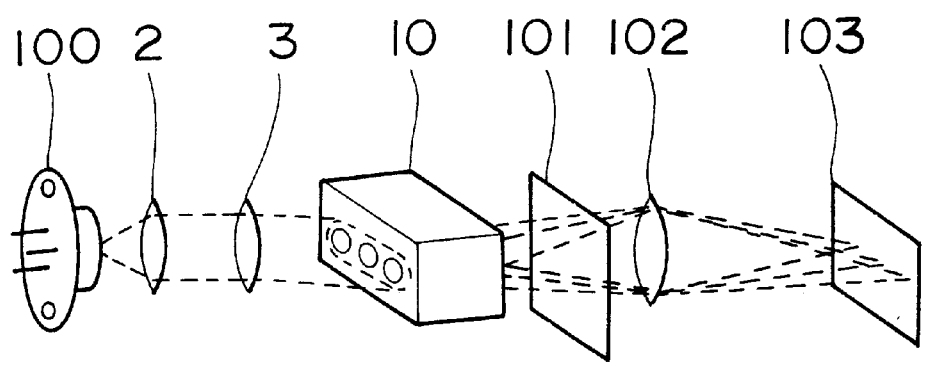
FIG. 32 is a schematic view showing an apparatus for observation of a near-field pattern.
Figure 34:
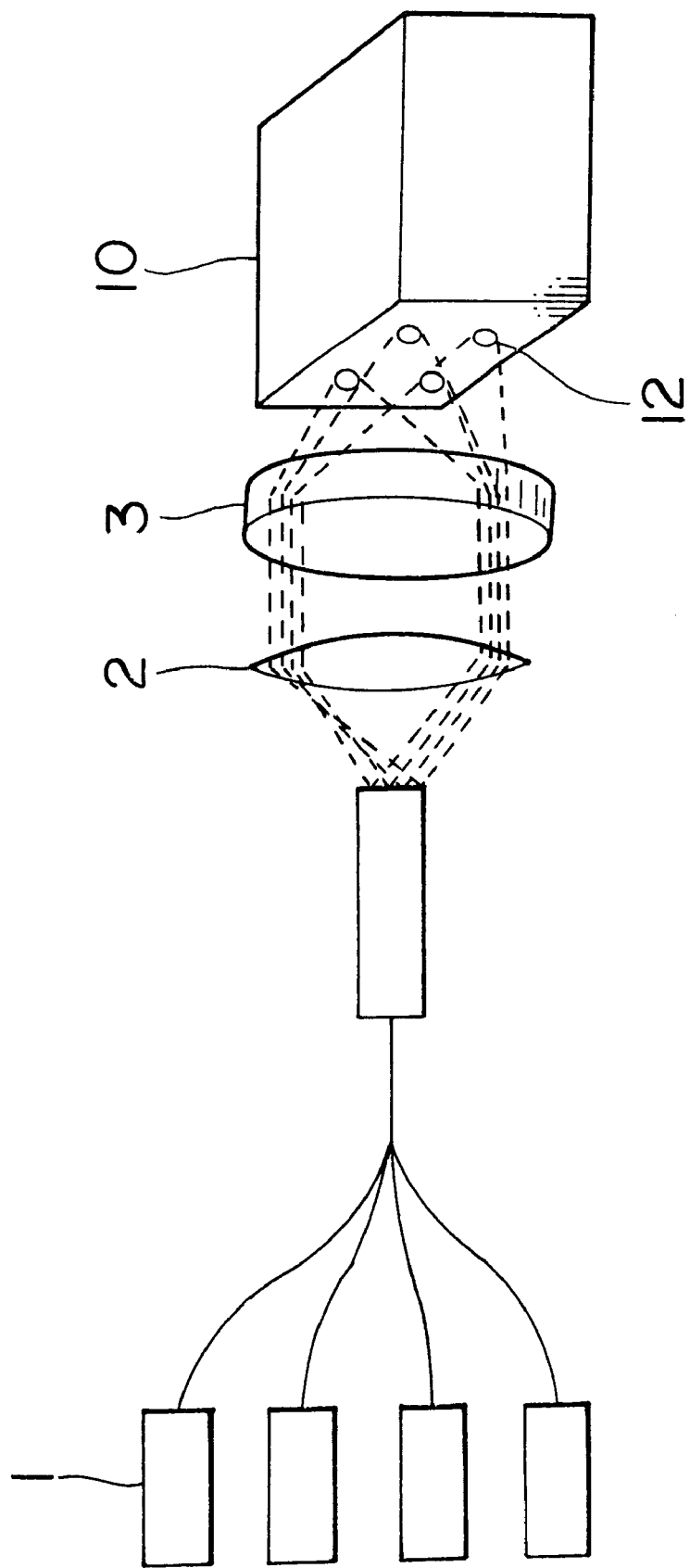
FIG. 34 is a schematic view showing another example of laser apparatus of the array type of the present invention.

An example of a laser apparatus of the array type of the present invention is shown in FIG. 31, FIG. 32 and another example is shown in FIG. 34.

In the following, a method of manufacturing an optical device of the present invention and a laser apparatus which employs the optical device will be described in connection with several examples with reference to the drawings. According to the following examples, a convex arcuate face or a concave arcuate face 12 can be formed on an optical material in the various devices described above. Normally, a plurality of convex arcuate faces 12 or the like are formed on an optical material having a somewhat great area, and they are used as they are as optical devices or they are cut for each convex arcuate face 12 and so forth to form an optical device.

EXAMPLE 1

First, a first example of method of manufacturing an optical device of the present invention will be described with reference to FIGS. 1a–1d.

A glass substrate 40 was used as an optical material on which a convex arcuate face 12 was to be formed. Photoresist OFPR800 made by Tokyo Ohka Kogyo Kabushiki Kaisha. was spin coated on a surface of the glass substrate 40, and then the glass substrate 40 was pre-baked to form a photoresist film 42 of 0.6 μm thick (refer to FIG. 1a).

Subsequently, using as an exposing apparatus an enlarging machine 50 of the model CF670 made by Fuji Shashin Film Kabushiki Kaisha. in which a FUJINON EX 50 mm lens set to F4 was mounted, the enlarging machine was adjusted such that the size of a pattern formed on an exposure negative 52 and the size of an image of the pattern might have the ratio of 1:1. It is to be noted that, though not shown, an upper lamp house was removed and a cold mirror of the center wavelength of 400 nm was mounted, and then an extra-high pressure mercury lamp was set to a lamp house of the model UIS-5100 made by Ushio Denki-Kabushiki Kaisha so that ultraviolet rays were introduced as an exposure light source into the lamp house. The pattern of the negative 52 was a circular pattern.

The glass substrate 40 on which the photoresist film 42 was formed was set to a focus position (refer to FIG. 1b), and ultraviolet rays were irradiated upon the glass substrate 40 to form, on the photoresist film 42, an image of the pattern formed on the negative 52, whereafter the photoresist film 42 was developed. Consequently, the photoresist film 42 of a circular shape having a diameter of 100 μm remained on the surface of the glass substrate 40 as shown in FIG. 1c. The surface of the circular photoresist film 42 had a generally spherical shape and the radius of curvature of the surface was about 2 mm.

When a lens having a low resolution such as that in an enlarging machine for a photographic film is used, the amount of ultraviolet rays irradiated upon the photoresist film 42 increases from a central portion toward a peripheral portion of each circular pattern. Therefore, if the photoresist film 42 on which images of patterns are formed are developed, then the thickness of the photoresist film 42 remaining on the surface of the glass substrate 40 decreases from a central portion to a peripheral portion of each circular pattern. Accordingly, the surface of the photoresist film 42 after development presents a generally spherical profile.

It is to be noted that, when the glass substrate 40 on which the photoresist film 42 was formed was set to a position displaced by 3 mm from the focus position and then similar processing was performed, the photoresist film 42 of a circular shape having a diameter of 60 μm was left on the surface of the glass substrate 40. The surface of the circular photoresist 42 had a generally spherical profile and the radius of curvature of the spherical face was about 1.5 mm.

Further, when a white circular shape pattern was photographed in a somewhat defocused condition to obtain a negative film having a circular pattern wherein a circular central portion is black and the photographing density decreases toward an outer periphery and the negative film was used as the negative 52 for circular pattern transfer, a semi-spherical photoresist pattern was formed without particularly effecting a defocusing operation for the glass substrate 40.

The glass substrate 40 obtained in this manner and having the circular photoresist film 42 of the diameter of 100 μm formed thereon was dry etched using a dry etching equipment of the model ECR-310 made by Nichiden Aneruba Kabushiki Kaisha. Dry etching conditions were such that, after the dry etching equipment was exhausted to 6.5×10$^{-4}$ Pa, $C_2F_6$ was introduced by 5 SCCM (Standard cubic Centimeter Minute) into the equipment, and etching was performed for one hour at the high frequency output of 300 W, the enclosing magnetic field of 10$^{-2}$ T and the ion accelerating voltage of 500 V.

By the dry etching under the conditions, the photoresist film 42 formed on the surface of the glass substrate 40 was etched and disappeared completely. Simultaneously, also the glass substrate 40 was etched so that a convex arcuate face 12 having a generally spherical shape having the diameter of about 100 μm and the radius of curvature of about 4 mm was formed on the surface of the glass substrate 40 (refer to FIG. 1d). The reason why the radius of curvature of the convex arcuate face 12 formed on the surface of the glass substrate 40 and the radius of curvature of the surface of the photoresist film 42 are different from each other is that the etching rates at the glass substrate 40 and the photoresist. film 42 are different from each other.

EXAMPLE 2

Subsequently, a second example of method of manufacturing an optical device of the present invention will be described.

A glass substrate 40 was used as an optical material on which a convex arcuate face 12 was to be formed. Photoresist OFPR800 made by Tokyo Ohka Kogyo Kabushiki Kaisha. was spin coated on a surface of the glass substrate 40, and then the glass substrate 40 was pre-baked to form a photoresist film 42 of 0.6 μm thick (refer to FIG. 2a). Using a mask aligner of the model QUINTEL Q6000, the photoresist film 42 was exposed to light in a condition wherein the distance between the photomask 60 and the photoresist film 42 was kept equal to 20 μm (refer to FIG. 2b).

It is to be noted that, in this instance, a diffuser 62 (DFSQ-50C02-1500 made by Siguma Koki) obtained by sand-blasting of the opposite faces of an optical glass substrate BK7 of 1 mm thick with abrasive grain of alumina of #1500 was placed on the photomask 60 so that diffused light having passed through the diffuser 62 might be irradiated upon the photoresist film 42 on the glass substrate 40 through the photomask 60. In this instance, the photomask 60 used was made of sodium lime glass, 4 inches square and 0.09 inches thick and had a circular pattern having a diameter equal to or smaller than 100 μm.

Subsequently, development of the photoresist film 42 was performed using developer NMD-3 made by Tokyo Ohka Kogyo Kabushiki Kaisha. After development and rinsing with pure water, the photoresist film 42 of a circular pattern having a diameter equal to or smaller than 100 μm remained on the glass substrate 40 (refer to FIG. 2b).

The surface of the photoresist film 42 was a convex arcuate face 42a of a substantially spherical shape having the radius of curvature of about 4 mm. In this manner, the circular photoresist film 42 having the generally spherical convex arcuate face 42a was able to be formed by using diffused light with a suitable distance left between the photomask 60 and the photoresist film 42 in this manner.

The glass substrate 40 obtained in this manner was dry etched using the dry etching equipment of the model ECR-310 E made by Nichiden Aneruba Kabushiki Kaisha. Dry etching conditions were such that, after the dry etching equipment was exhausted to 6.5×10$^{-4}$ Pa, $C_2F_6$ was introduced by 5 SCCM into the equipment, and etching was performed for 20 minutes at the high frequency output of 300 W, the enclosing magnetic field of 10$^{-2}$ T and the ion accelerating voltage of 700 V.

By the dry etching under the conditions, the photoresist film 42 formed on the surface of the glass substrate 40 was etched and disappeared completely. Simultaneously, also the glass substrate 40 was etched so that a convex arcuate face 12 having a generally spherical shape having the diameter of about 100 μm and the radius of curvature of about 4 mm was formed on the surface of the glass substrate 40 (refer to FIG. 2d).

EXAMPLE 3

A case wherein the black and white are reversed is shown in (a) to refer to FIGS. 3a–3d. In this instance, a generally spherical concave arcuate face 12c having the diameter of 100 μm and the radius of curvature of about 4 mm was formed similarly to the case of the Example 2.

EXAMPLE 4

Further, a fourth example of method of manufacturing an optical device of the present invention will be described.

A photoresist film 42 of 15 μm thick was formed on a glass substrate 40, and while the distance between a photomask 60 and the photoresist film 42 was held equal to 8 mm, the photoresist film 42 was exposed to light using the photomask 60 having a circular pattern of the diameter of 1 mm, whereafter development was performed under the same conditions as in the second example so that the photoresist film 42 of a circular profile was left on a surface of the glass substrate 40. The diameter of the photoresist film 42 thus left was 0.8 mm and the radius of curvature of the surface was about 8 mm. The glass substrate 40 was dry etched similarly as in the second example. However, the etching time was 8 hours. A convex arcuate face 12 of a substantially spherical profile having the diameter of 0.8 mm and the radius of curvature of 8 mm was formed on the surface of the glass substrate 40 after etching.

The ratio between the etching rates at the photoresist film 42 and the glass substrate 40 can be varied by varying a dry etching condition such as, for example, the amount of gas to be introduced into the dry etching equipment, the accelerating voltage or the like. Consequently, even if the radius of curvature of the convex arcuate face 42a of the photoresist film 42 left on the glass substrate 40 is equal, the radius of curvature of the convex arcuate face 12 of the surface of the glass substrate 40 after dry etching can be varied. For example, when the glass substrate 40 on which the photoresist film 42 having the generally spherical convex arcuate face 42a having the diameter of 100 μm and the radius of curvature of about 4 mm was dry etched in accordance with the following dry etching conditions, the radii of curvature of the generally spherical convex arcuate faces 12 on the surface of the glass substrate 40 obtained were such as described below.

| Gas Used | $C_2F_6$ | $C_2F_6$ |
|---|---|---|
| Quantity of Gas (SCCM) | 3 | 10 |
| High Frequency Output (W) | 300 | 300 |
| Enclosing Magnet Field (T) | $10^{-2}$ | $10^{-2}$ |
| Ion Accelerating Voltage (V) | 700 | 300 |
| Etching Time | 45 min. | 75 min. |
| Radius of Curvature of Spherical Convex Arcuate Face on Surface of Glass Substrate (mm) | 2.8 | 5.6 |

EXAMPLE 5

Further, a fifth embodiment of method of manufacturing an optical device of the present invention will be described.

A glass substrate 40 was used as an optical material on which a convex arcuate face 12 was to be formed. Photoresist OFPR800 made by Tokyo Ohka Kogyo Kabushiki Kaisha. was spin coated on a surface of the glass substrate, and then the glass substrate was pre-baked to form a photoresist film 42 of 8 μm thick (refer to FIG. 4a).

Subsequently, by a so-called close contact exposure method wherein a photomask 60 was closely contacted with the photoresist film 42, the photoresist film 42 was exposed to light through the photo mask with a circular pattern of the diameter of 100 μm (refer to FIG. 4c). The photoresist film 42 was developed using developer NMD-3 made by Tokyo Oka Kogyo Kabushiki Kaisha and then rinsed with pure water. The photoresist film 42 of a column-shaped profile of the diameter of 100 μm remained on the glass substrate 40 ((c) of FIG. 4).

The glass substrate 40 was placed for 30 minutes in a clean oven of 175° C. Since the photoresist film 42 was held at a temperature higher than a glass transition point of the material constituting the photoresist film 42, part of it was thermally fluidized so that it was deformed into a liquid drop so that a generally spherical convex arcuate face 42a having the radius of curvature of about 100 μm was formed (refer to FIG. 4d). The heating conditions for the photoresist film 42 must only be a temperature higher than a glass transition point of the material constituting the photoresist film 42 and a time sufficient for part of the photoresist film 42 to be thermally fluidized.

The glass substrate 40 obtained in this manner was dry etched using the dry etching equipment of the model ECR-310 E made by Nichiden Aneruba Kabushiki Kaisha. Dry etching conditions were such that, after the dry etching equipment was exhausted to $6.5 \times 10^{-4}$ Pa, oxygen was introduced by 5 SCCM into the equipment, and etching was performed for 1 hour at the high frequency output of 300 W, the enclosing magnetic field of $10^{-2}$ T and the ion accelerating voltage of 500 V.

By the dry etching under the conditions, the photoresist film 42 formed on the surface of the glass substrate 40 was etched and disappeared completely. Simultaneously, also the glass substrate 40 was etched so that a convex arcuate face 12 having a generally spherical shape having the diameter of about 100 μm and the radius of curvature of about 5 mm was formed on the surface of the glass substrate 40 (refer to FIG. 4e).

The etching rate can be varied by varying the ion accelerating voltage, and at the accelerating voltages of 300 V and 700 V, the radius of curvature of the generally spherical convex arcuate face 12 on the surface of the glass substrate 40 was about 10 and 2.5 mm, respectively.

Further, when not a circular shape but an elliptic shape is used for a pattern of the photomask 60, the convex arcuate face 12 to be formed finally on the surface of the glass substrate 40 does not have a spherical shape but has a shape of a face of an ellipsoid of revolution, but also the convex arcuate face 12 of such a shape of a face of an ellipsoid of revolution was able to be formed readily by the method of the example described above.

EXAMPLE 6

A convex arcuate face 12 was formed on a surface of a glass substrate 40 by a method similar to that of the Example 4 except that the pattern of the photomask 60 was an elliptic shape having the major diameter of 150 μm and the miner diameter of 75 μm. When the ion accelerating voltage was set to 500 V, the convex arcuate face 12 on the surface of the glass substrate 40 obtained had the shape of a face of an ellipsoid of revolution having the radius of curvature of about 11.3 mm on the major diameter side and the radius of curvature of about 2.8 mm on the minor diameter side.

With an optical material other than the glass substrate 40, for example, with such a material as $KNbO_3$ or $Nd:Y_3Al_5O_{12}$, when the etching rate is different from that of the glass substrate 40, a convex arcuate face 12 or a concave arcuate face can be formed readily on a surface of the same by a method similar to those of the Examples 1 to 6 described above.

EXAMPLE 7

The present example is an example wherein it was tested to see in what manner a spherical convex arcuate face of a glass substrate after etching varies when an etching condition is varied continuously during etching using photoresist, on which a spherical face is formed, as a mask. First, a generally spherical convex arcuate face 42*a* having the radius of curvature of about 100 μm was formed on a glass substrate 40 similarly as in the Example 5 except that the photoresist film 42 was formed with the thickness of 6 μm.

Subsequently, the glass substrate 40 on which the false spherical face was formed from the photoresist in this manner was set to the dry etching equipment of the model ECR-310 E made by Nichiden Aneruba Kabushiki Kaisha. and exhausted to $6.5 \times 10^{-4}$ Pa, and then oxygen was introduced by 5 SCCM into the dry etching equipment. Thus, etching was performed for one hour and thirty minutes at the high frequency output of 300 W and the enclosing magnetic field of $10^{-2}$ T while decreasing the ion accelerating voltage at the rate of 1 V/minute from 500 V.

In this instance, the photoresist disappeared completely, and the profile of the photoresist was transferred to the glass substrate so that a spherical face having some deformation wherein the diameter was about 100 μm and the radius of curvature was 5 mm at a central portion and 4.3 mm at a peripheral portion was produced.

Figure 14:
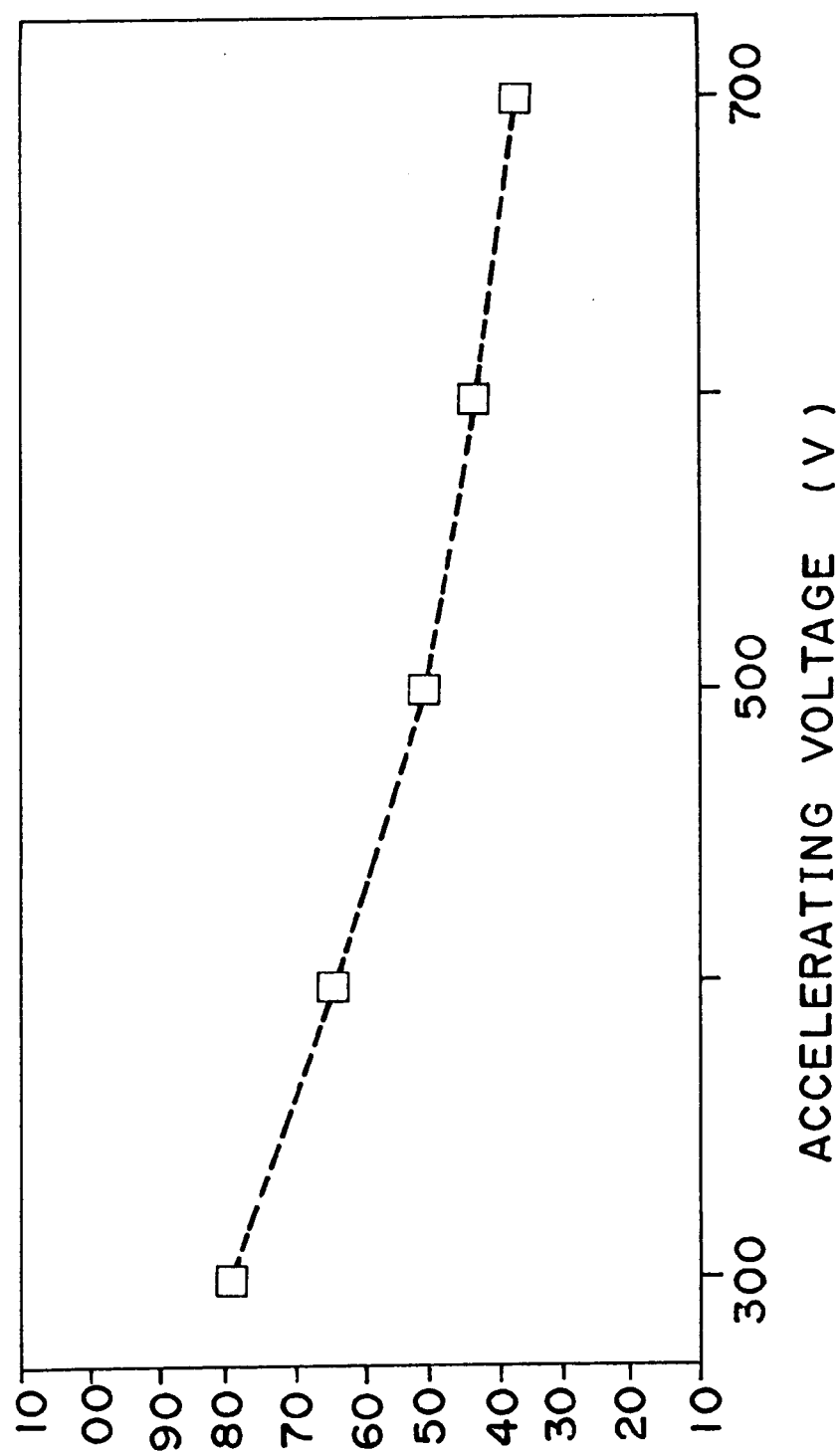
FIG. 14 is a diagram illustrating comparison between the speeds of etching of a photoresist film and a glass substrate when the accelerating voltage is varied as a dry etching condition.

FIG. 14 shows a relationship between the accelerating voltage (X-axis) and the ratio between the etching rates at the photoresist OFPR800 made by Tokyo Ohka Kogyo Kabushiki Kaisha and the BK7 glass substrate in the ECR-310 E equipment when the glass substrate is etched using the photoresist as a mask. As apparently seen from FIG. 14, if an etching condition is varied continuously during etching, arbitrary distortion in a radial direction can be provided to a spherical face of the glass substrate.

While, in the present example, the accelerating voltage was continuously varied to control the profile of the spherical face after etching, a similar effect is obtained if not the accelerating voltage but some other parameter such as the gas flow rate or the high frequency output is varied. Further, even if a parameter is varied not continuously but stepwise, a spherical face having stepwise distortion in a radial direction is obtained.

When the profile of the spherical face after development and rinsing is an elliptic column-shaped profile, an aspherical elliptic lens which is most suitable for convergency of light of a laser diode can be manufactured by this method.

According to this method, an etching condition can be varied during etching to form an aspherical face having an arbitrary degree of distortion from a spherical face.

EXAMPLE 8

The present example is an example wherein faults by polishing abrasive grain upon mirror face polishing of an optical material are removed by dry etching.

Figure 15:
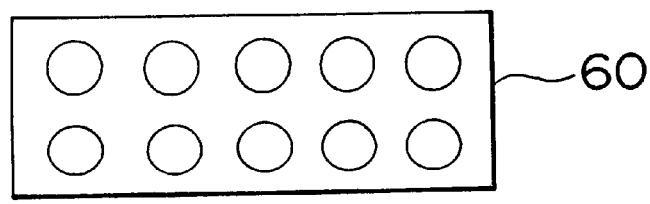
FIG. 15 is a top plan view of an example of photomask used for production of an optical device of the ring laser type.

$KNbO_3$ single crystal was used as an optical material on which a convex arcuate face 12 was to be formed. While the forming method itself of the convex arcuate face 12 was substantially same as in the Example 5, a photomask having a plurality of circular patterns like 2 dimensional array thereof as shown in FIG. 15 was used as a photomask 60. After close contact exposure was performed similarly as in the Example 5 using the $KNbO_3$ single crystal piece in place of a glass substrate and using the photomask having the plurality of circular patterns thereon in this manner, development with NMD-3 developer and rinsing with pure water were performed to form a plurality of photoresist films of a column-shaped profile having the diameter of 100 μm corresponding to the circular patterns on the single crystal piece. Subsequently, the single crystal piece was thermally heated in the clean oven similarly as in the Example 5 and then dry etched using the dry etching equipment of the model ECR-310 E made by Nichiden Aneruba Kabushiki Kaisha. By the operation under the dry etching conditions described above, a plurality of generally spherical convex arcuate faces 12 having the diameter of about 100 μm and the radius of curvature of about 6.0 mm were formed on a surface a of the $KNbO_3$ single crystal piece 70.

Subsequently, a dielectric multi-layer film made of $SiO_2$ and $TiO_2$ was coated by vapor deposition on the face a of the single crystal piece 70 to form a total reflecting film (transmission factor 4% with the wavelength of 860 nm, reflection factor 99.5% with the wavelength of 430 nm) (not shown), and another dielectric multi-layer film was coated on another face b of the single crystal piece 70 to form a semi-transmitting film (reflection factor 99.5% with the wavelength of 860 nm, transmission factor 80% with the wavelength of 430 nm) (not shown). After then, the face c side of the single crystal piece 70 was first cut as shown in refer to FIG. 16*b* and then the cut face was polished successively using polishing grains GC #1000, #2000, #3000 and #4000 made by Fujimi Kenmazai Kogyo Kabushiki Kaisha. and then polished into a mirror face similarly using Compol-EX made by Fujimi Kenmazai Kogyo Kabushiki Kaisha. After then, a portion of the single crystal piece 70 for one resonator was cut as shown in FIG. 16*b* to make a non-linear optical device of the ring laser type.

Figure 17:
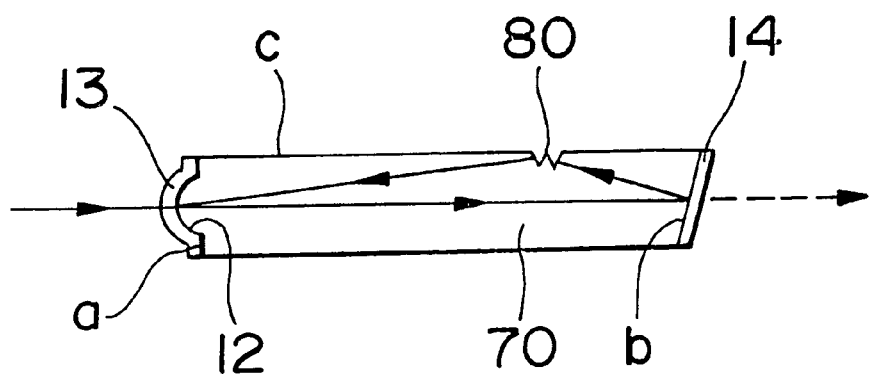
FIG. 17 is an illustrative view showing an optical path in the optical device of the ring laser type.

In the present condition, the face c of the optical device was not a perfect mirror face, and when it was observed using a differential interference microscope, faults by polishing were found. If the face c has no fault thereon, then part of light introduced into such an optical device through the lens 12 is, as shown in FIG. 17 (in the figure, full line arrow marks denote incidence light, broken line arrow marks denote transmission light, reference 80 denotes a fault on the face c shown schematically, 13 a total reflecting film, and 14 a semi-transmitting film), reflected by the face b as indicated by the solid line arrow marks and the reflected light is all returned to the lens 12 again. However, since the polished face c has a fault 80 thereon, the reflected light is scattered at the portion of the fault 80, and consequently, part of the incidence light will not be returned to the lens 12. However, according to the present invention, such polish faults can be eliminated by the following method.

First, after the cutting and polishing the face c of the crystal piece 70 in a condition shown in (b) of FIG. 16, photoresist OFPR800 made by Tokyo Ohka Kogyo Kabushiki Kaisha. was spin coated on the face c, whereafter the crystal piece 70 was pre-baked to form a photoresist film 42 having a film thickness of 600 nm. Subsequently, the photoresist film 42 (and the face c of the crystal piece 70)

were etched using the dry etching equipment of the model ECR310 made by Nichiden Aneruba Kabushiki Kaisha. Etching conditions were such that, after the dry etching equipment was exhausted to $6.5 \times 10^{-4}$ Pa, $C_2F_6$ was introduced by 5 SCCM into the equipment, and etching was performed at the high frequency output of 300 W, the enclosing magnetic field of $10^{-2}$ T and the ion accelerating voltage of 700 V.

Figure 18A:
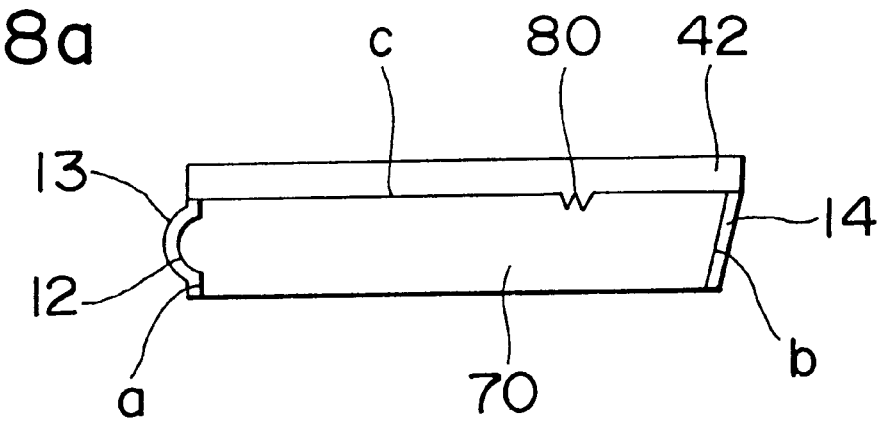
FIGS. 18a–18b are schematic diagrammatic views illustrating a fault removing method for a mirror face polished face according to the present invention.
Figure 18B:
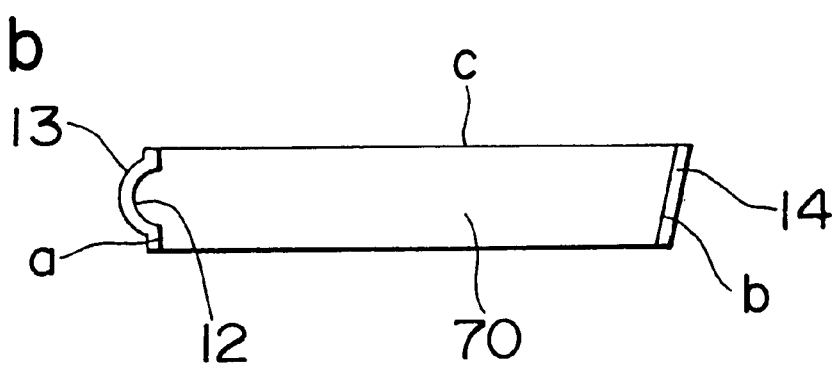
Figure 21:
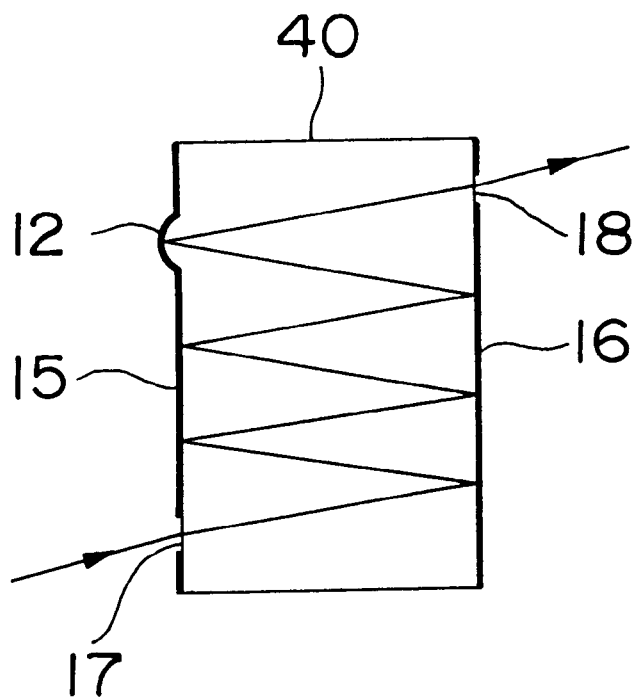
Figure 22:
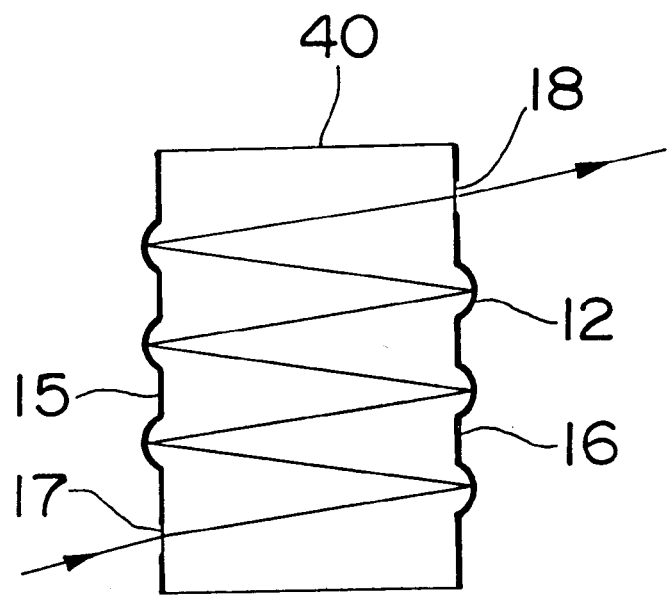
FIG. 22 is a diagrammatic sectional view showing another example of optical device which has convex arcuate faces on the both faces opposing to each other and has a zigzag optical path.
Figure 23:
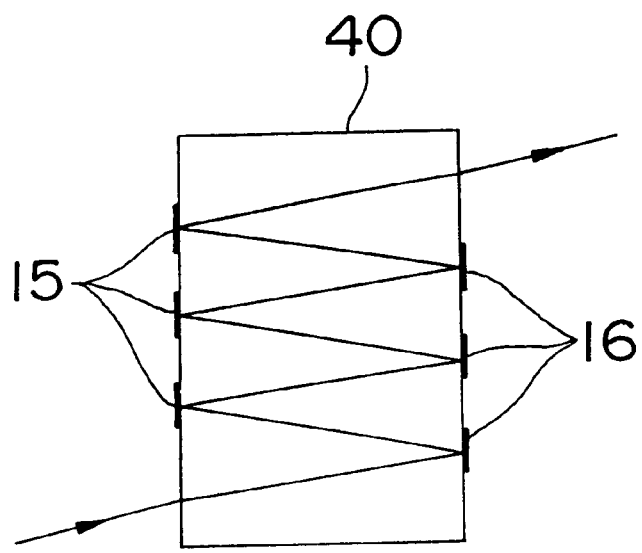
FIGS. 23, 24 and 25 are diagrammatic sectional views showing further examples of optical device which have reflecting portions each in the form of a flat plate and have a zigzag optical path.
Figure 24:
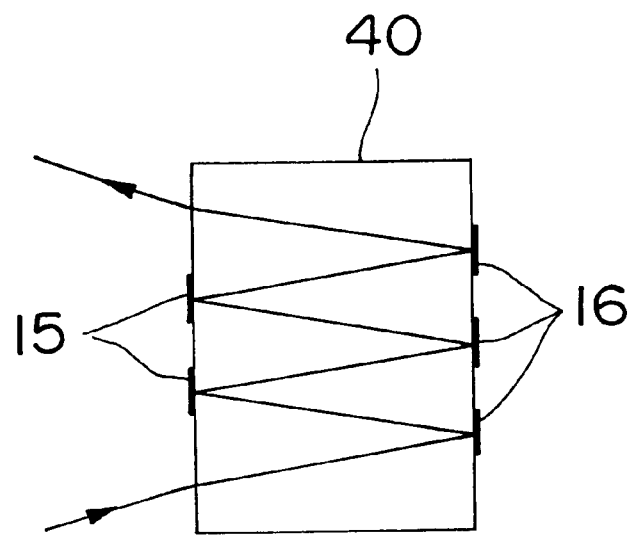
Figure 25:
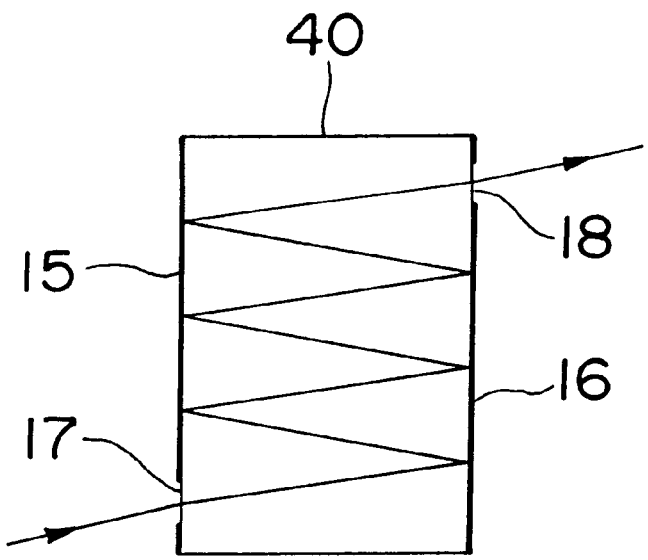
Figure 26:
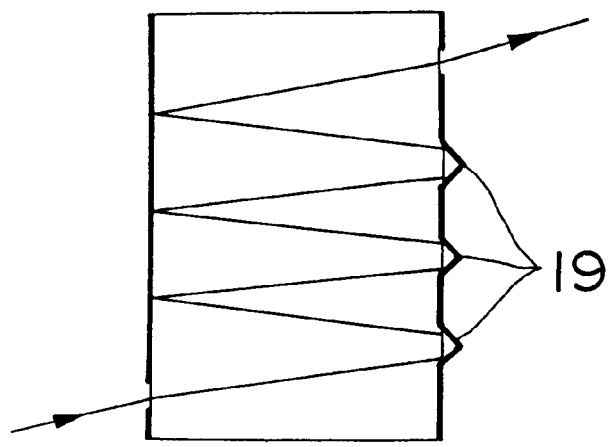
FIG. 26 is a diagrammatic sectional showing an optical device which has a reflecting portion formed from prisms and has a zigzag optical path.
Figure 27:
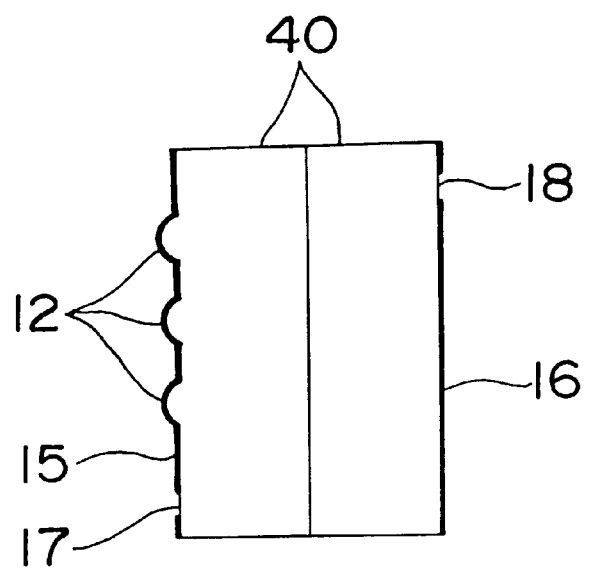
FIGS. 27 and 28 are diagrammatic sectional views of optical devices wherein two materials are joined to each other and convex arcuate faces are formed on one and both of the faces opposing to each other, respectively.
Figure 28:
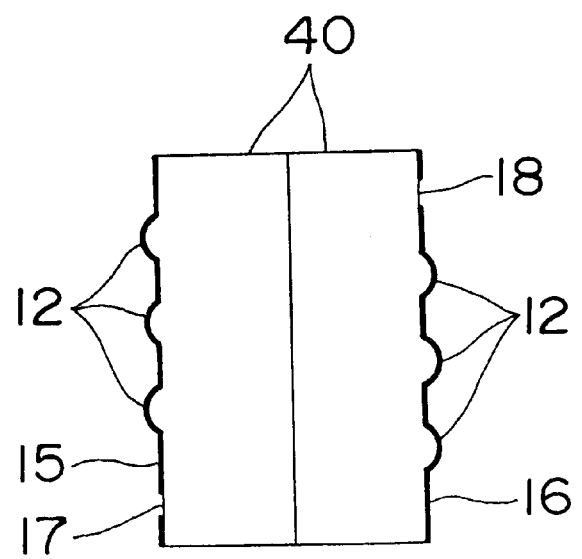

When etching was performed for 30 minutes under the conditions, the photoresist disappeared completely. After then, etching was continued under the same conditions, and after etching for a total of 3 hours, the crystal piece 70 was taken out. The surface of the crystal was etched by about 3 μm, and by observation of the differential interference microscope, faults by polishing which were observed before etching disappeared and an almost perfect mirror face was obtained as shown in FIG. 18b. After then, the crystal piece 70 was cut in a profile shown in FIG. 16c.

Figure 16A:
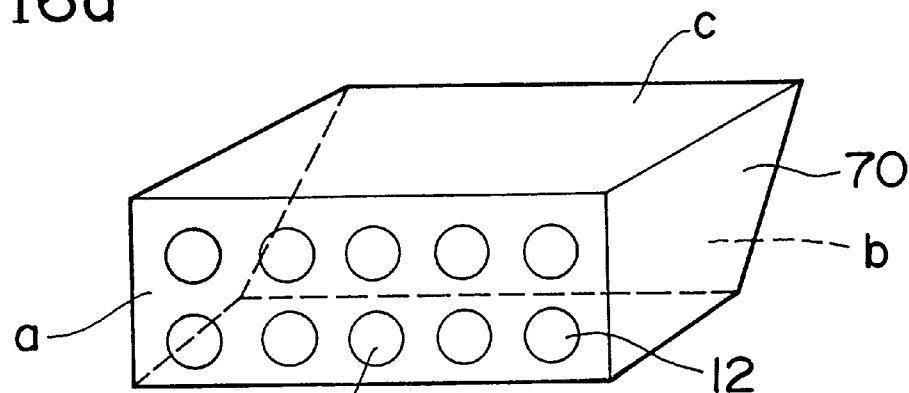
FIGS. 16a–16c are schematic views illustrating a cutting procedure employed for production of the optical device of the ring laser type.
Figure 16B:
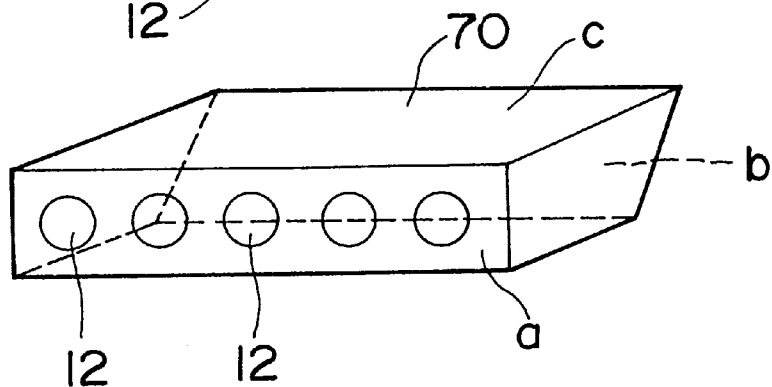
Figure 16C:
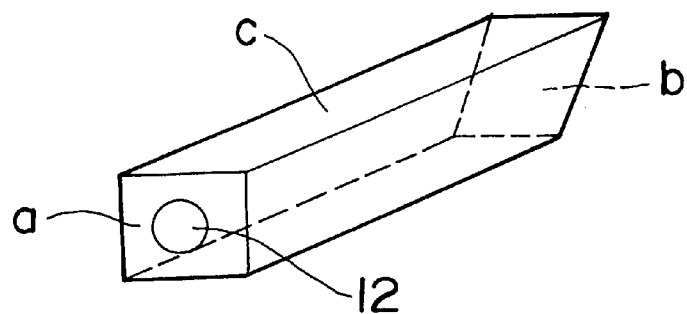

Meanwhile, it is also possible to apply such processing in advance to the face b shown in FIG. 16a.

Figure 19:
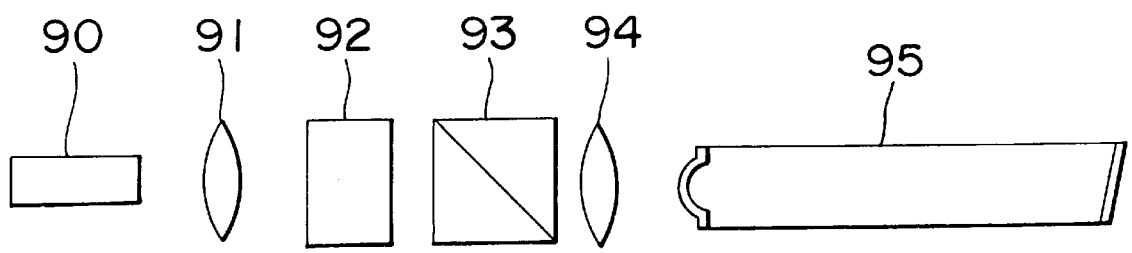
FIG. 19 is a schematic view showing an example of optical system which employs an optical device of the ring laser type of the present invention.
Figure 20:
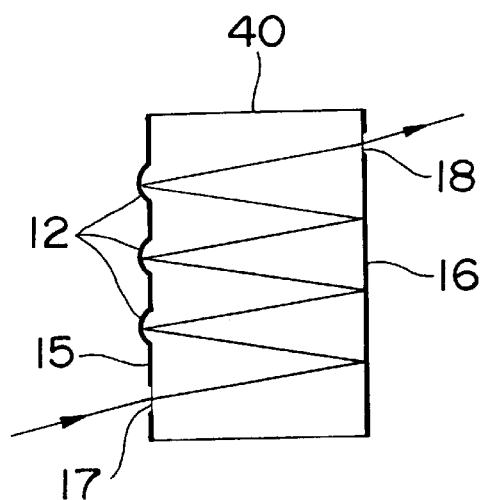
FIGS. 20 and 21 are diagrammatic sectional views showing examples of optical device which have a convex arcuate face on a face thereof and have a zigzag optical path.

Subsequently, the optical device from which faults had been removed in this manner was set as an optical device 95 on a non-linear optical system for SHG generation shown in FIG. 19 and was excited with the wavelength of 862 nm from its spherical face side using a laser diode SLD 7033101 made by Sanyo Electric Co., Ltd. Consequently, an output of the wavelength of 431 nm was obtained with 5 mW at the highest. It is to be noted that reference numeral 90 in FIG. 19 denotes the laser diode, 91 a converging lens F-L40B made by New Port Co., 92 a cylindrical lens pair for shaping a beam (aspect ratio 1:2), 93 a Faraday isolator ISO-7885 made by New Port Co., and 94 a converging lens (f=62.9 mm, plano-convex lens).

The optical devices on which convex arcuate faces are formed in the Examples 1 to 8 described so far can be used as optical devices having a zigzag optical path by applying a coating to them and providing a reflecting portion and a window portion to them.

EXAMPLE 9

Subsequently, an example of laser apparatus of the array type will be described.

An outline of an example of laser apparatus of the present invention is shown in FIG. 31. The laser apparatus is constituted from a solid-state laser resonator 10, a pair of focusing lenses 2 and 3 and a laser diode 100 of the multi-stripe type serving as an exciting light source of laser oscillation.

The laser diode 100 of the multi-stripe type is a GaAlAs laser diode of the double hetero type designed such that the oscillation wavelength may be 809 nm, and has five active waveguides of 3 μm wide at an interval of 100 μm. The focusing lenses 2 and 3 are focusing lenses F-L40B made by New Port Co.

The solid-state laser resonator 10 is a laser rod made of Nd:YAG crystal and has five convex arcuate faces having the diameter of 95 μm and the radius of curvature of 7 mm formed on an end face thereof at a distance of 100 μm on a straight line. A coating is formed on an incidence face of the solid-state laser resonator 10 for exciting light such that the reflection factor at the wavelength of 1.06 μm may be 99.95% and the transmission factor at the wavelength of 809 nm may be 83%, and another coating is formed on an opposing face of the solid-state laser resonator 10 such that the reflection factor at the wavelength of 1.06 μm may be 96.5% and the reflectionffactor at the wavelength of 809 nm may be 99.8%. The length of the resonator is 3.75 mm.

Formation of the convex arcuate faces on the end face of the laser rod was performed in the following manner.

Figure 1A:
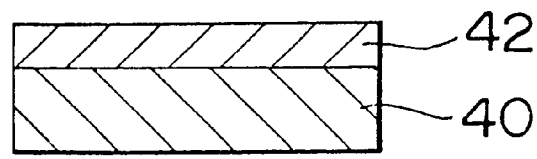
FIGS. 1*a*–1*d* are schematic diagrammatic views showing different steps of an example of manufacturing method for an optical device of the present invention.
Figure 1B:
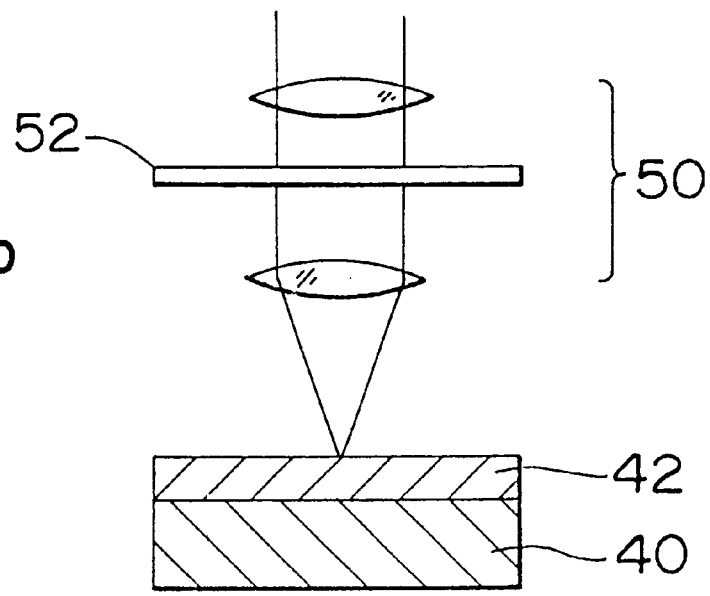
Figure 1C:
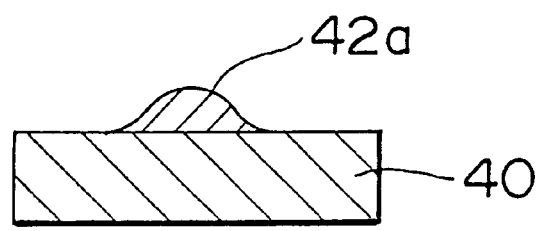
Figure 1D:
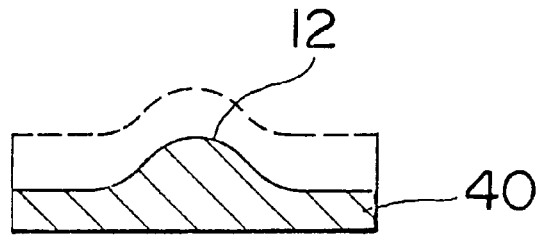

Photoresist OFPR800 made by Tokyo Ohka Kogyo Kabushiki Kaisha. was spin coated on the end face of the laser rod (20 mm×20 mm×3.75 mm), and then the laser rod was pre-baked to form a photoresist film 42 of 0.6 μm thick (refer to FIG. 1a).

Then, using as an exposure apparatus the enlarging machine 50 of the model CF670 made by Fuji Shashin Film Kabushiki Kaisha. on which the FUJINON EX 50 mm lens set to F4 was mounted, the enlarging machine was adjusted such that the ratio between the size of a pattern formed on an exposure negative 52 and the size of an image of the pattern might be 1:1. It is to be noted that, though not shown, the upper lamp house was removed and the cold mirror of the center wavelength of 400 nm was mounted, and then the extra-high pressure mercury lamp was set to the lamp house of the model UIS-5100 made by Ushio Kabushiki Kaisha so that ultraviolet rays were introduced as an exposure light source into the lamp house. The pattern of the negative 52 was a circular pattern.

The laser rod 40 on which the photoresist film 42 was formed was set to a focus position (refer to FIG. 1b), and ultraviolet rays were irradiated upon the laser rod 40 to form, on the photoresist film 42, an image of the pattern formed on the negative 52, whereafter the photoresist film 42 was developed. Consequently, the photoresist films 42a of a circular shape having the diameter of 96 μm remained on the surface of the laser rod 40 as shown in FIG. 1c. The surface of each circular photoresist film 42a had a generally spherical shape and the radius of curvature of the surface was about 5 mm.

When a lens having a low resolution such as that in an enlarging machine for a photographic film is used, the amount of ultraviolet rays irradiated upon the photoresist film 42 increases from a central portion toward a peripheral portion of each circular pattern. Therefore, if the photoresist film 42 on which images of patterns are formed are developed, then the thickness of the photoresist film 42 remaining on the end face of the laser rod decreases from a central portion to a peripheral portion of each circular pattern. Accordingly, the surface of the photoresist film 42 after development presents a generally spherical profile.

It is to be noted that, when the laser rod 40 on which the photoresist film 42 was formed was set to a position displaced by 1.5 mm from the focus position and then similar processing was performed, the photoresist film 42 of a circular shape having the diameter of 60 μm was left on the surface of the laser rod 40. The surface of the circular photoresist 42 had a generally spherical profile and the radius of curvature of the spherical face was about 12 mm.

Further, when a white circular shape pattern was photographed in a somewhat defocused condition to obtain a negative film having a circular pattern wherein a circular central portion is black and the photographing density decreases toward an outer periphery and the negative film was used as the negative 52 for circular pattern transfer, a semi-spherical photoresist pattern was formed without particularly displacing the focus position.

The laser rod 40 obtained in this manner and having the circular photoresist film 42 of the diameter of 96 μm formed thereon was dry etched using the dry etching equipment of the model ECR-310 made by Nichiden Aneruba Kabushiki Kaisha. Dry etching conditions were such that, after the dry etching equipment was exhausted to $6.5 \times 10^{-4}$ Pa, $C_2F_6$ was introduced by 5 SCCM (Standard Cubic Centimeter Minute)

into the equipment, and etching was performed for one hour at the high frequency output of 300 W, the enclosing magnetic field of $10^{-2}$ T and the ion accelerating voltage of 500 V.

By the dry etching under the conditions, the photoresist film 42 formed on the end face of the laser rod 40 was etched and disappeared completely. At the same time, also the laser rod 40 was etched so that a convex arcuate face 12 having a generally spherical shape having the diameter of about 95 $\mu$m and the radius of curvature of about 7 mm was formed on the end face of the laser rod 40 (refer to FIG. 1d). The reason why the radius of curvature of the convex arcuate face formed on the end face of the laser rod and the radius of curvature of the surface of the photoresist film are different from each other is that the etching rates at them are different from each other.

The coating was performed such that, using a vacuum vapor depositing equipment, thin films of $SiO_2$ and $TiO_2$ optically corresponding to a ½ wavelength were alternately layered. More particularly, on the incidence face for exciting light, a film of $SiO_2$ of about 0.36 $\mu$m thick and a film of $TiO_2$ of about 0.27 $\mu$m thick were alternately layered for 8 cycles (a total of 16 layers). On the emergence face, a layer of $SiO_2$ of about 0.36 $\mu$m thick and a layer of $TiO_2$ of about 0.27 $\mu$m thick were alternately layered for 4 cycles (a total of 8 layers) and then a layer of $SiO_2$ of about 0.27 $\mu$m thick and a layer of $TiO_2$ of about 0.21 $\mu$m thick were alternately layered for 8 cycles (a total of 16 layers) as a reflecting film for 810 nm.

The laser resonator 4 of the array type manufactured in this manner, the laser diode 1 and the focusing lenses 2 and 3 are arranged such that laser light outputted from the laser diode 1 may be introduced into the convex arcuate faces on the end face of the laser rod.

Subsequently, a near-field pattern of output light of the laser apparatus of the present invention was investigated.

Construction of an apparatus for observation of a near-field pattern is shown in FIG. 32. A laser diode (model SDL2432 made by SPECTRA DIODE LABS.) of the multi-stripe type having the oscillation wavelength of 809 nm was used as the exciting source, and a focusing lens F-L40B (focal length 4.8 mm) made by New Port Co. was used as the focusing lens 2 on the exciting source side while a focusing lens AV1815 (focal length 18.07 mm) made by Olympus Kabushiki Kaisha was used as the focusing lens 3 on the laser resonator side.

The laser resonator 10 is a laser resonator wherein convex arcuate faces are formed on a Nd:YAG rod and coatings are applied to the opposite end faces of the rod in a similar manner as described hereinabove, and three convex arcuate faces having the diameter of 95 $\mu$m and the radius of curvature of 7 mm are formed at an interval of 100 $\mu$m on the face of the laser resonator on the focusing lens side.

They are arranged such that laser light outputted from the laser diode 100 may be introduced into the convex arcuate faces on the end face of the laser rod, and further, as shown in FIG. 32, a filter 101 (model ITF-50S-100RM made by Siguma Koki) which attenuates exciting light of the wavelength of 809 nm but transmits therethrough the oscillation wavelength of 1.06 $\mu$m of the Nd:YAG crystal, a plano-convex lens (focal length 50 mm) 102 for observing a near-field pattern and a CCD element 103 for a beam profiler not shown are disposed on the output side of the laser rod.

The laser diode 1 has active waveguides at a distance of 10 $\mu$m over the width of 100 $\mu$m, and emitted rays of light over the width of 100 $\mu$m can be enlarged to the width of 400 $\mu$m and projected to the three spherical faces by the focusing lenses 2 and 3 to excite the three spherical faces to obtain three laser beams. A near-field pattern when laser oscillation is performed with the apparatus described above is shown in FIG. 33.

Figure 33:
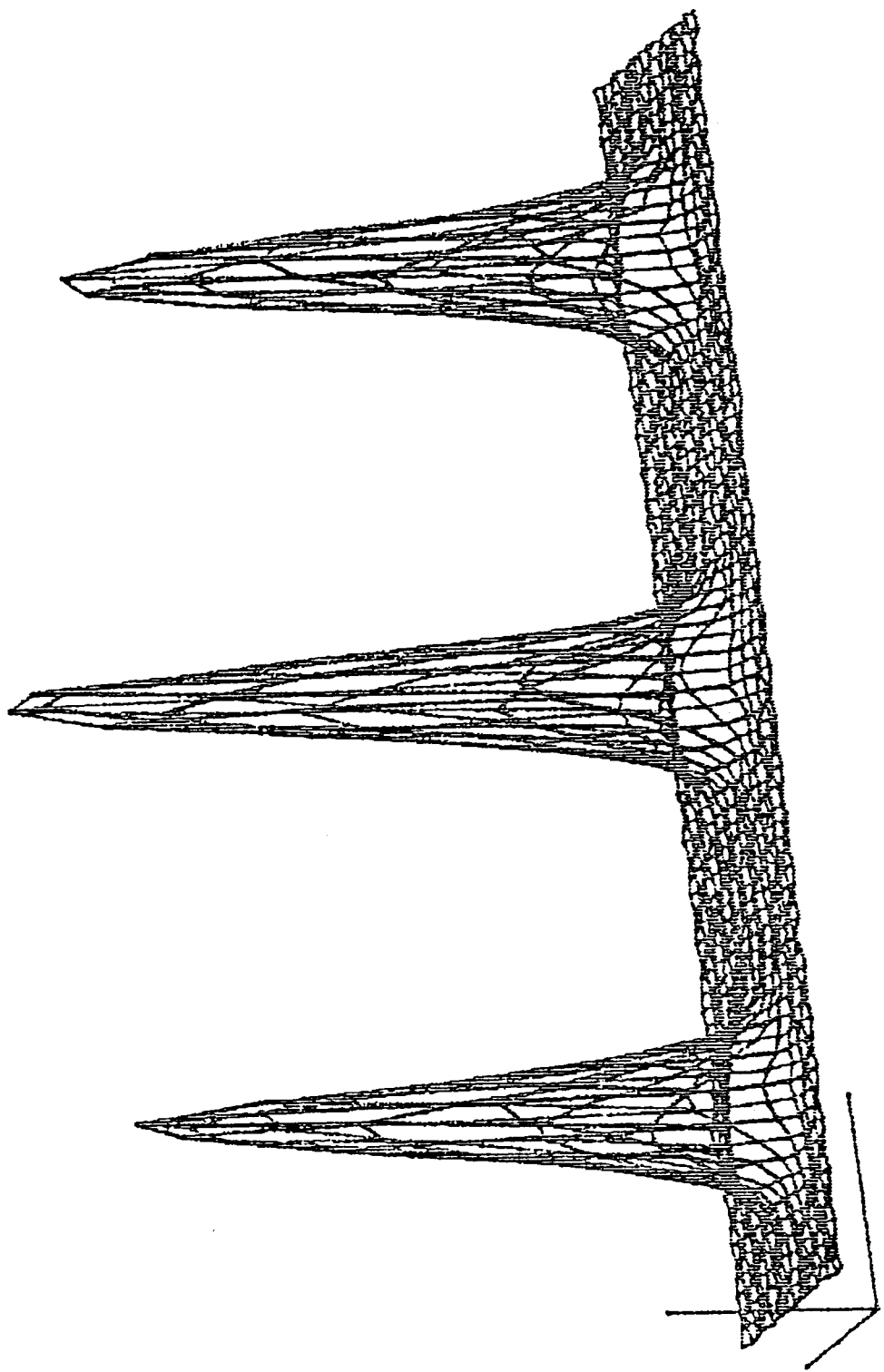
FIG. 33 is a diagrammatic view showing a near-field pattern when laser oscillation is performed with the apparatus of FIG. 32.

As apparent from FIG. 33, is can be seen that three laser beams having similar profiles are oscillated at the same time.

EXAMPLE 10

Subsequently, a second example of laser apparatus of the present invention is shown in FIG. 34. In the present example, four laser diodes of the single type are provided, and four optical fibers for guiding laser light from the laser diodes are provided. The four optical fibers are bundled at end portions thereof and are opposed to a laser resonator 10. The laser resonator 10 was manufactured similarly as in the preceding example, and four convex arcuate faces are disposed, at an end face of a laser medium, at the four corners of a square corresponding to the bundle of the four optical fibers. Further, a pair of focusing lenses 2 and 3 disposed between the optical fibers and the laser oscillator.

Action and effects of the present example are also similar to those of the preceding example.

EXAMPLE 11

Subsequently, an example of short wavelength laser apparatus wherein an optical device having a zigzag optical path is employed as a higher harmonic wave converting device will be described.

An outline of construction of a higher harmonic wave converting device and a short wavelength laser apparatus according to the present example is shown in FIG. 30. Referring to FIG. 30, reference numeral 1 denotes a laser diode SLD7033101 made by SANYO Kabushiki Kaisha, 2 a focusing lens F-L40B made by New Port Co., 3 a plano-concave lens $\phi$=25 mm, f=62.9 mm, and 10 a higher harmonic wave converting device according to the present invention obtained by polishing a face a of a single crystal piece of $KNbO_3$, forming convex arcuate faces on one face, applying a high reflection coating on the one face and removing part of the coating.

Reference numeral 12 denotes a convex spherical face formed on a surface of the light transmitting optical material, 17 an incidence window formed by removing part of the coated film in order to admit a basic wave into the light transmitting optical material, and 18 a higher harmonic wave outputting window formed by removing part of the coated film in order to extract a higher harmonic wave from the light transmitting optical material. A broken line indicates an optic axis.

The coating is performed for the face of the light transmitting optical material having the convex spherical faces and another face opposing to the face such that the reflection factor at the wavelength of 860 nm may be 99.95% and the reflection factor at the wavelength of 430 nm may be 99.9%.

Figure 29:
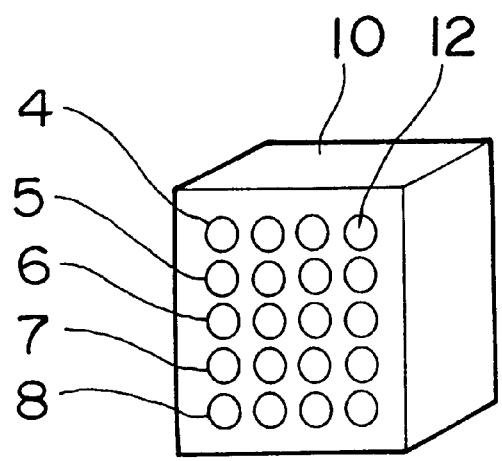
FIG. 29 is a perspective view showing an example of optical device having a zigzag optical path.

A perspective view of a higher harmonic wave converting device actually produced using $KNbO_3$ as a light transmitting optical material is shown in FIG. 29. The higher harmonic wave converting device was made in the following manner.

Photoresist OFPR800 made by Tokyo Ohka Kogyo Kabushiki Kaisha was spin coated on a surface of the $KNbO_3$ material having a face a of 10 mm×10 mm and the thickness of 5 mm, and pre-baking was performed for the photoresist film of 6 mm thick. Then, a photomask having circular light intercepting patterns was closely contacted with a surface of the photoresist film and ultraviolet rays were irradiated upon the photoresist film to effect close contact exposure. In this instance, a plurality of combinations of circular patterns wherein the diameter was varied by small amounts among 104 μm, 102 μm, 100 μm, 98 μm and 96 μm were disposed on the photomask. The sets of the individual diameters correspond to rows of convex spherical faces denoted by 4 to 8 in FIG. 29.

The photoresist film exposed to ultraviolet rays was developed for one minute with developer NMD-3 made by Tokyo Ohka Kogyo Kabushiki Kaisha and then rinsed with pure water, whereafter it was dried. The photoresist films each in the form of a round column remained on the $KNbO_3$ material. The $KNbO_3$ material was first dried for 30 minutes in the clean oven of 100° C. and then post-baked for one hour in the clean oven of 175° C. As a result, generally spherical convex arcuate faces were formed due to thermal fluidization.

The $KNbO_3$ material on the surface of which the spherical photoresist was formed in this manner was dry etched using the dry etching equipment of the model ECR-310E made by Nichiden Aneruba Kabushiki Kaisha to transfer the convex spherical faces produced from the photoresist. In this instance, etching conditions were: etching gas, oxygen 5SCCM; microwave input 300 W; ion enclosing magnetic field $10^{-2}$ T; and ion accelerating voltage 325 V.

The radii of curvature of the convex spherical faces produced in this manner were 10.44 mm with the spherical faces produced from the pattern of the diameter of 104 μm, and 10.26 mm, 10.12 mm, 9.96 mm and 9.80 mm with the spherical faces produced from the patterns of the diameters of 102 μm, 100 μm, 98 μm and 96 μm, respectively.

A high reflection coating consisting of $TiO_2$ and $SiO_2$ was applied to each of the face on which the spherical faces were formed and the opposing face of each of the $KNbO_3$ single crystal blocks on which the convex spherical faces had been formed in this manner. Prior to such coating, TSMR8900 photoresist made by Tokyo Ohka Kogyo Kabushiki Kaisha was first spin coated on the side of the $KNbO_3$ single crystal blocks on which the spherical faces were formed, and then pre-baking was performed to form a film of the thickness of 9 μm, whereafter the photoresist was left, by close contact exposure and developing processing, only at a window portion through which a waveform was to be admitted.

In this condition, $TiO_2$ and $SiO_2$ were alternately electron beam vapor deposited by means of an electron beam vapor depositing apparatus of the model EX-550 made by Nippon Shinku Kabushiki Kaisha so as to vapor deposit them for 6 cycles in 12 layers in a condition wherein a maximum reflection factor was obtained at the wavelength of 860 nm and then for 12.5 cycles in 25 layers in another condition wherein a maximum reflection factor was obtained at the wavelength of 430 nm. The vapor deposition was performed intermittently so that the temperature of the specimens might be equal to or lower than 160° C. to the highest. The reflection factor of the coated films was 99.95% at the wavelength of 860 nm and 99.9% at the wavelength of 430 nm.

After the specimens were taken out of the vapor depositing apparatus, they were immersed in acetone and washed using an ultrasonic washer to remove the photoresist and the coated films vapor deposited on the photoresist to form incidence windows.

Subsequently, similar processing was applied also to the opposing faces, and coatings were provided and also higher harmonic wave output windows were formed. Each of them was set such that such construction as shown in FIG. 30 might be obtained, and laser light of the wavelength of 862 nm and the power of 78 mW was introduced into it such that the spherical faces having he radius of curvature of 10.12 mm might be used while keeping it at 31.7° C. As a result, a higher harmonic output of the wavelength of 431 nm and the power of 1.2 mW was obtained.

Figure 35:
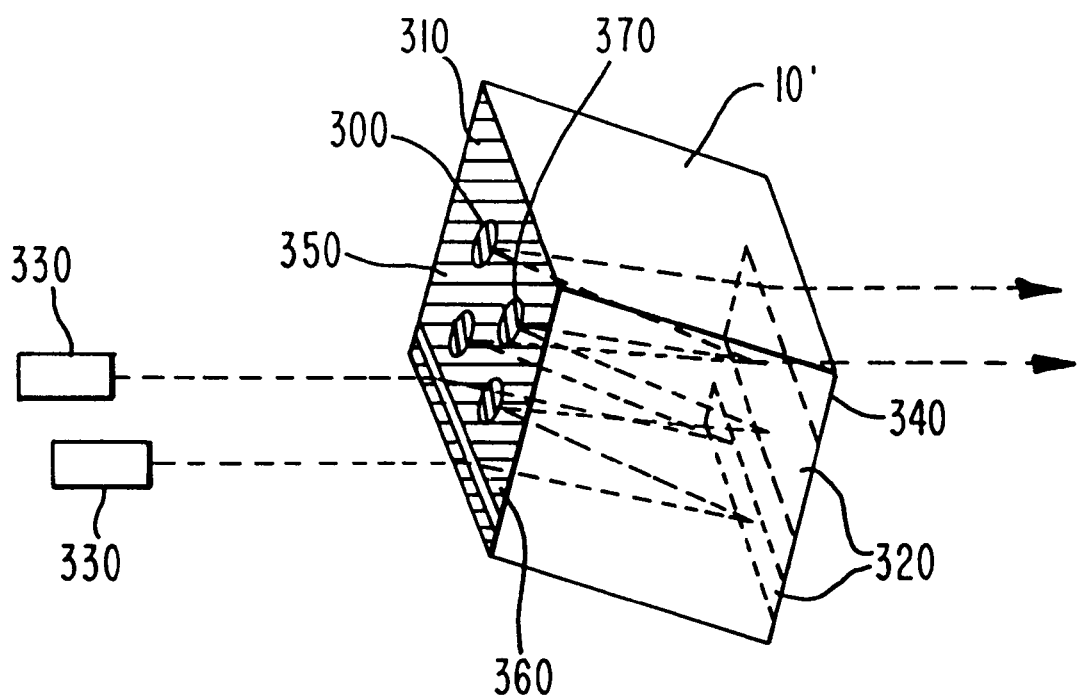
FIG. 35 is a schematic view showing another example of laser apparatus of the present invention.

The short wavelength laser apparatus can also be arranged as shown in FIG. 35. As shown in this figure, the apparatus is provided with a plurality of exciting sources 330 for producing a plurality of excitation laser beams, and an optical block. The optical block includes at least a part of laser resonators 10' that receive each of the excitation laser beams and emitting emitted laser beams with different wavelength from that of the excitation laser beams. The optical block has a first end face 310 and a second end face 340 disposed opposite the first end face 310. The first end face 310 includes a planar portion 350 and a plurality of convex arcuate portions 300. An entire surface of the second end face 340 is substantially planar. An optical film coats at least the convex arcuate portions 300.

The resonators further include totally reflective films 370 covering the convex arcuate portions 300, a semi-transmitting mirror 360 covering a portion of the first end face 310 other than the convex arcuate portions 300, and a plurality of optical films 320 coating at least a plurality of portions on the second end face 340. The optical films 320 can be any one of an anti-reflective film, a semi-transmitting mirror film, and a totally reflective film.

What is claimed is:

1. An optical device, comprising:
    a light transmitting non-linear optical material or laser material having a first face and a second face, said first and second faces opposing each other, said first face having a plurality of first reflecting portions provided thereon, said second face having a plurality of second reflecting portions provided thereon, each of said second reflecting portions corresponding to one of said first reflecting portions, said first and second faces being substantially flat except for at least one convex arcuate portion being formed on at least one of said first and second faces, and at least one of said first and second reflecting portions being obtained by coating a reflective material on said arcuate portion.

2. An optical device, comprising:
    a light transmitting non-linear optical material or a laser material having a first face and a second face, said first and second face opposing each other, said first face having a plurality of first reflecting portions provided thereon, said second face having a plurality of second reflecting portions provided thereon, each of said second reflecting portions corresponding to one of said first reflecting portions, said first face having at least one convex arcuate portion and a flat portion parallel to said second face formed thereon, said at least one convex arcuate portion being coated with a first reflective material, said second face being flat and at least one of said second reflecting portions being obtained by coating a second reflective material on said second face.

3. A laser apparatus, comprising:
    an exciting source producing at least one excitation laser beam; and
    a laser resonator receiving said at least one excitation laser beam, said laser resonator including, a light transmitting non-linear optical material or laser material having a first face and a second face, said first and second face opposing each other, said first face having a plurality of first reflecting portions provided thereon, said second face having a plurality of second reflecting portions provided thereon, each of said second reflecting portions corresponding to one of said first reflecting portions, said first and second faces being substantially flat except for at least one convex arcuate portion being formed on at least one of said first and second faces, and at least one of said first and second reflecting portions being obtained by coating a reflective material on said convex arcuate portion.

4. The laser apparatus of claim 3, wherein said exciting source produces a plurality of excitation laser beams and said laser resonator receives respective ones of said excitation laser beams, wherein said laser resonator includes said light transmitting non-linear optical material or laser material having a plurality of convex arcuate portions formed on said one of said first and second faces which is flat.

5. The laser apparatus of claim 4, wherein each of said convex arcuate portions receives a corresponding one of said excitation laser beams.

6. The laser apparatus of claim 4, wherein said exciting source includes a semiconductor laser of a multistripe type which outputs a plurality of laser beams as said excitation laser beams.

7. The laser apparatus of claim 4, wherein said exciting source includes a plurality of laser producing devices, each of said laser producing devices producing a laser beam as an excitation laser beam, each of said laser producing devices including an optical fiber which guides said laser beam to a corresponding one of said plurality of convex arcuate portions of said resonator.

8. A laser apparatus of claim 3, wherein said light transmitting non-linear optical material or laser material is formed integrally.

9. An optical device of claim 3, wherein said first face and said second face are coated with a reflective material to form said first and second reflecting portions, said reflective material each having a window for receiving and outputting said at least one excitation beam.

10. A laser apparatus, comprising:

a plurality of exciting sources producing a plurality of excitation laser beams; and an optical block, wherein said optical block including at least a part of laser resonators receiving each of said excitation laser beams and emitting emitted laser beams with different wavelength from that of the excitation laser beams, and said optical block having a first end face and a second end face disposed opposite said first end face, said first end face including a planar portion and a plurality of convex arcuate portions, an entire surface of said second end face being substantially planar, and optical film coating at least said convex arcuate portions on the first end face.

11. The laser apparatus of claim 10, wherein said optical film coated on at least said convex arcuate portions being a totally reflective film, and an anti-reflective film coating at least a plurality of portions on said second end face.

12. The laser apparatus of claim 11, wherein said laser resonators further includes a semi-transmitting mirror, coating a portion of said first end face other than said convex arcuate portions, opposed to said second end face.

13. The laser apparatus of claim 12, wherein said optical block is a laser medium.

14. The laser apparatus of claim 11, wherein said optical block is a laser medium.

15. The laser apparatus of claim 10, wherein said optical film coated on at least said convex arcuate portions being a totally reflective film, and a semi-transmitting mirror film coating at least a plurality of portions on said second end face.

16. The laser apparatus of claim 15, wherein said optical block is a laser medium.

17. The laser apparatus of claim 10, further comprising:

a totally reflective film coating at least a plurality of portions on said second end face and said optical film coated on at least said convex arcuate portions being a semi-transmitting mirror.

18. The laser apparatus of claim 17, wherein said optical block is a laser medium.

19. The laser apparatus of claim 10, wherein said optical block is a non-linear optical material.

* * * * *